US007413983B2

(12) United States Patent
Inoue et al.

(10) Patent No.: US 7,413,983 B2
(45) Date of Patent: Aug. 19, 2008

(54) PLATING METHOD INCLUDING PRETREATMENT OF A SURFACE OF A BASE METAL

(75) Inventors: Hiroaki Inoue, Tokyo (JP); Akira Susaki, Tokyo (JP)

(73) Assignee: Ebara Corporation, Tokyo (JP)

( * ) Notice: Subject to any disclaimer, the term of this patent is extended or adjusted under 35 U.S.C. 154(b) by 256 days.

(21) Appl. No.: 10/864,496

(22) Filed: Jun. 10, 2004

(65) Prior Publication Data

US 2005/0069646 A1 Mar. 31, 2005

(30) Foreign Application Priority Data

Jun. 13, 2003 (JP) .............................. 2003-169007
Aug. 28, 2003 (JP) .............................. 2003-304637

(51) Int. Cl.
*H01L 21/44* (2006.01)

(52) U.S. Cl. ........................ 438/687; 438/678; 438/692; 257/E23.161

(58) Field of Classification Search ................. 438/687, 438/678
See application file for complete search history.

(56) References Cited

U.S. PATENT DOCUMENTS 5,674,787 A 10/1997 Zhao et al.
5,695,810 A 12/1997 Dubin et al.
6,294,059 B1 9/2001 Hongo et al.
6,375,693 B1 * 4/2002 Cote et al. .................... 51/308
2001/0055934 A1 * 12/2001 Cheung ....................... 451/28
2005/0245080 A1 * 11/2005 Wang et al. ................. 438/678
2006/0003570 A1 * 1/2006 Shanmugasundram et al. ... 438/618

* cited by examiner

*Primary Examiner*—Thanh Nguyen
(74) *Attorney, Agent, or Firm*—Wenderoth, Lind & Ponack, L.L.P.

(57) ABSTRACT

The present invention provides a plating method and a plating apparatus which can securely form a metal film (protective film) by electroless plating on the exposed surfaces of a base metal, such as interconnects without the formation of voids in the base metal. The plating method including providing a semiconductor device having an embedded interconnect structure, carrying out pretreatment of interconnects with a pre-treatment liquid containing a surface activating agent for the interconnects, carrying out catalytic treatment of the interconnects with a catalytic treatment liquid containing catalyst metal ions and an excessive etching inhibitor for the interconnects, and forming a protective film by electroless plating selectively on the surfaces of the interconnects.

20 Claims, 28 Drawing Sheets

F I G. 1A
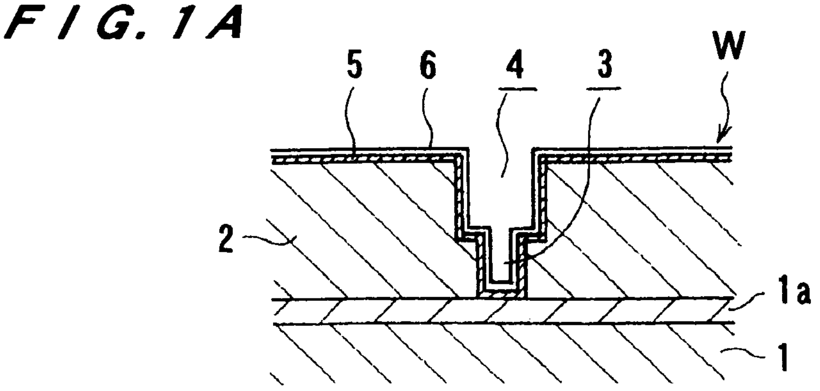
F I G. 1B
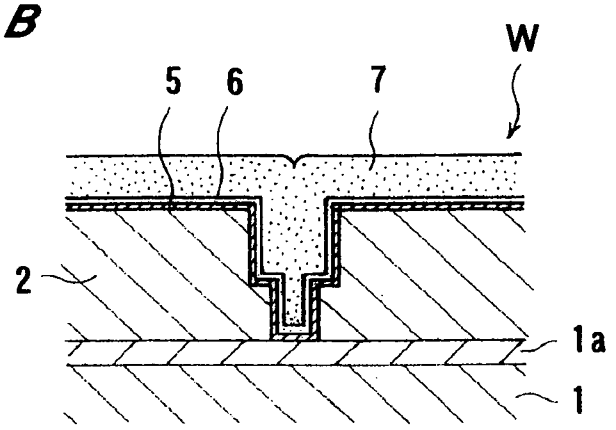
F I G. 1C
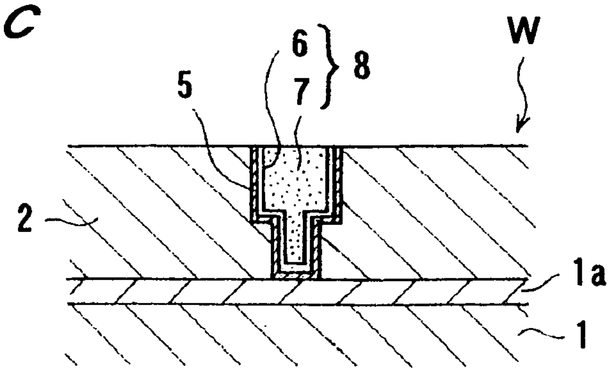
F I G. 1D
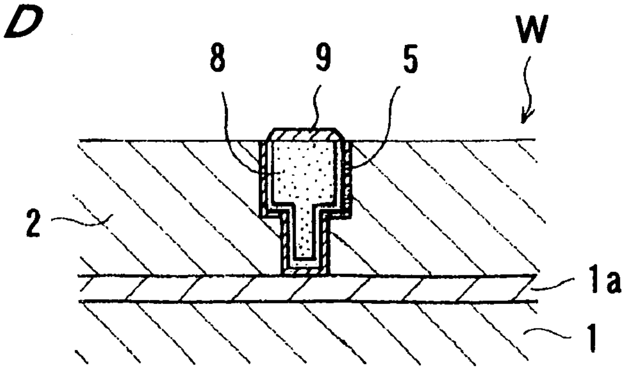

F I G. 9
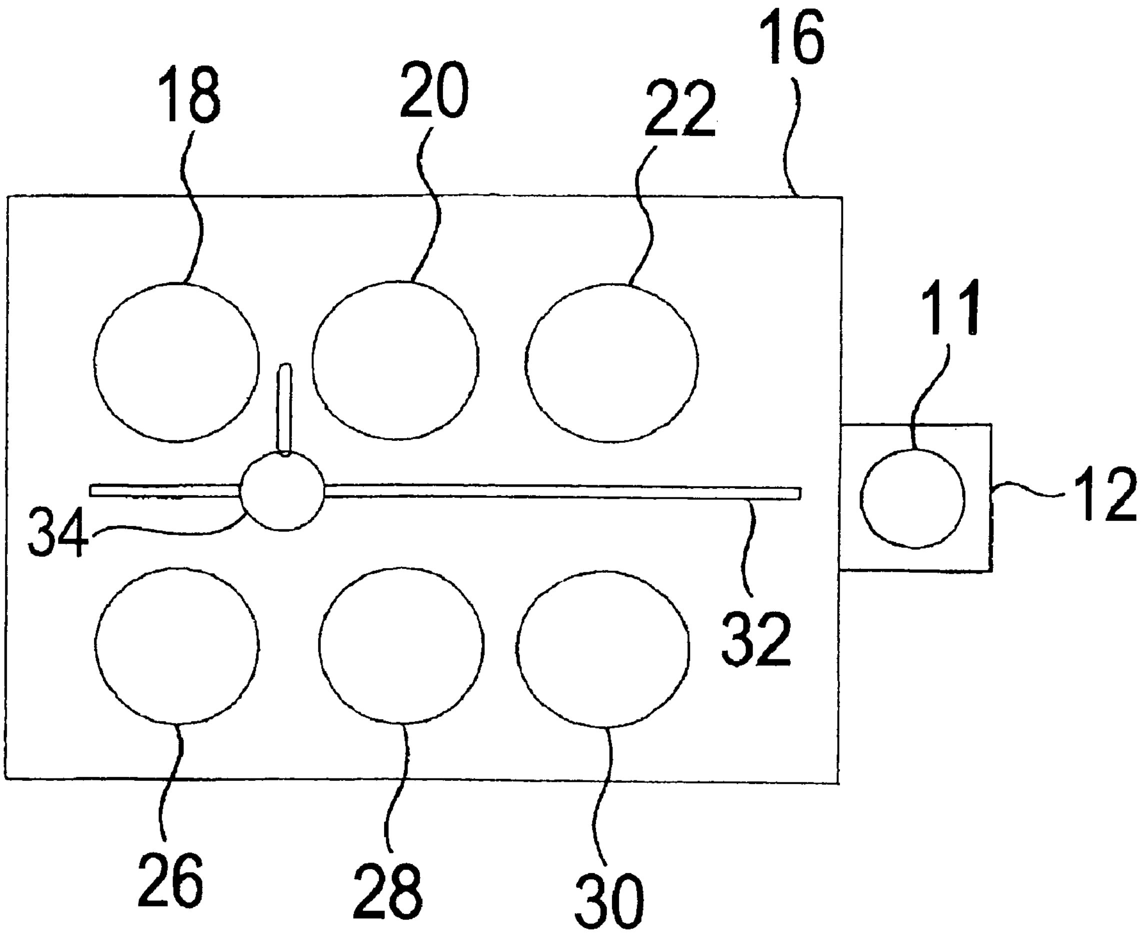

F I G. 1 0
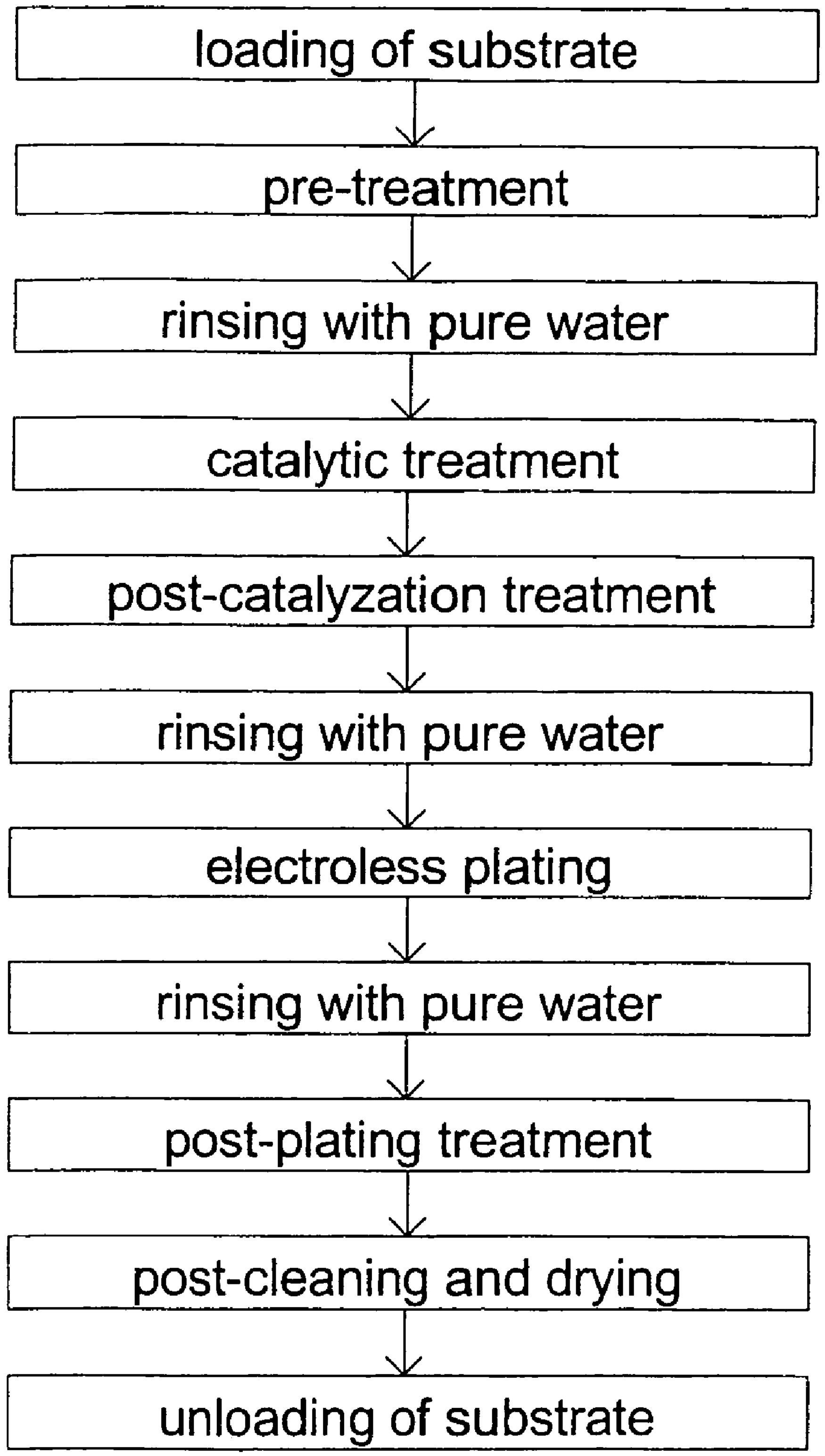

F I G. 1 1 A
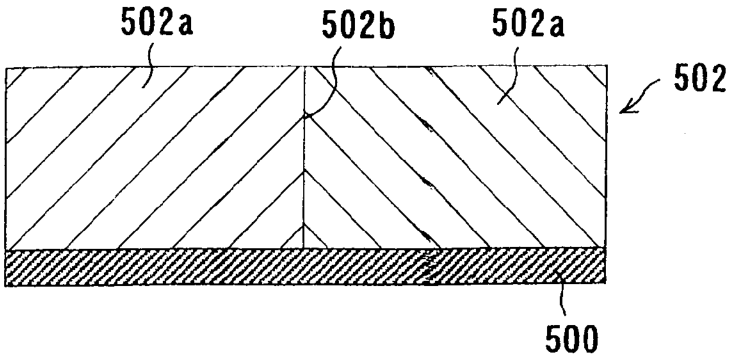
F I G. 1 1 B
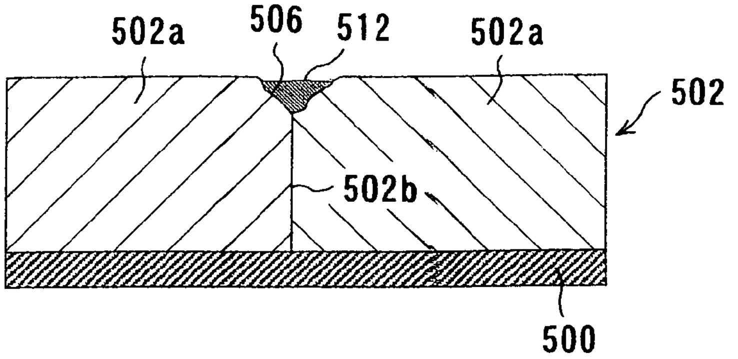
F I G. 1 1 C
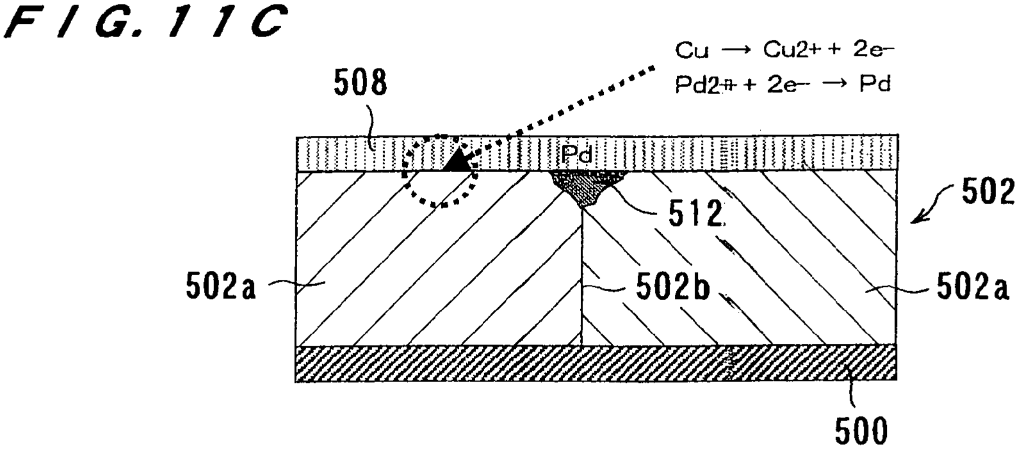
F I G. 1 1 D
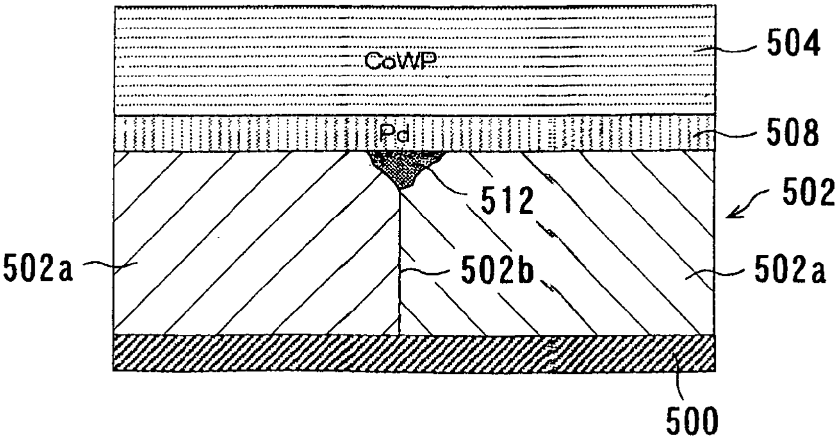

F I G. 1 2
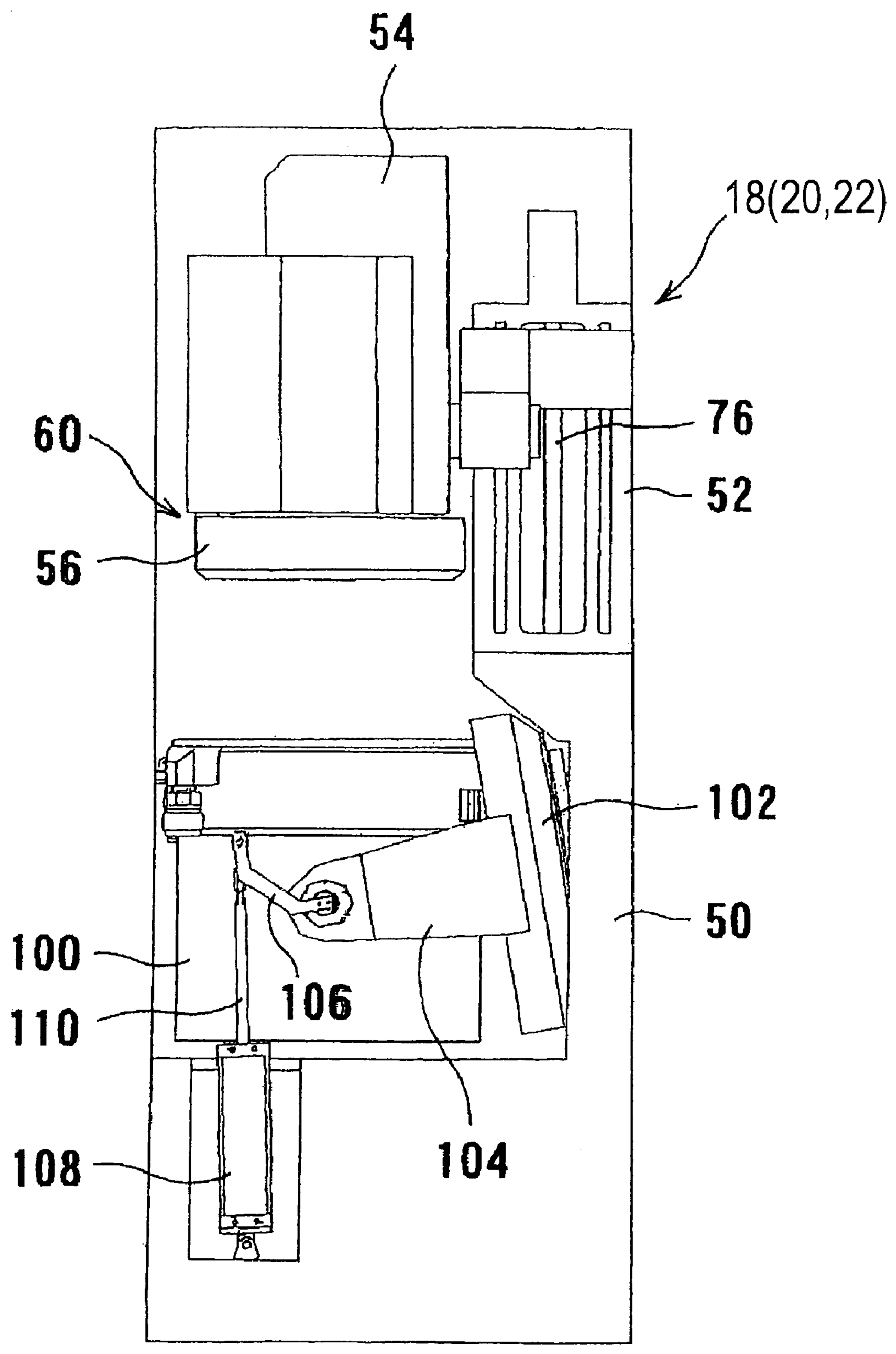

F I G. 1 4
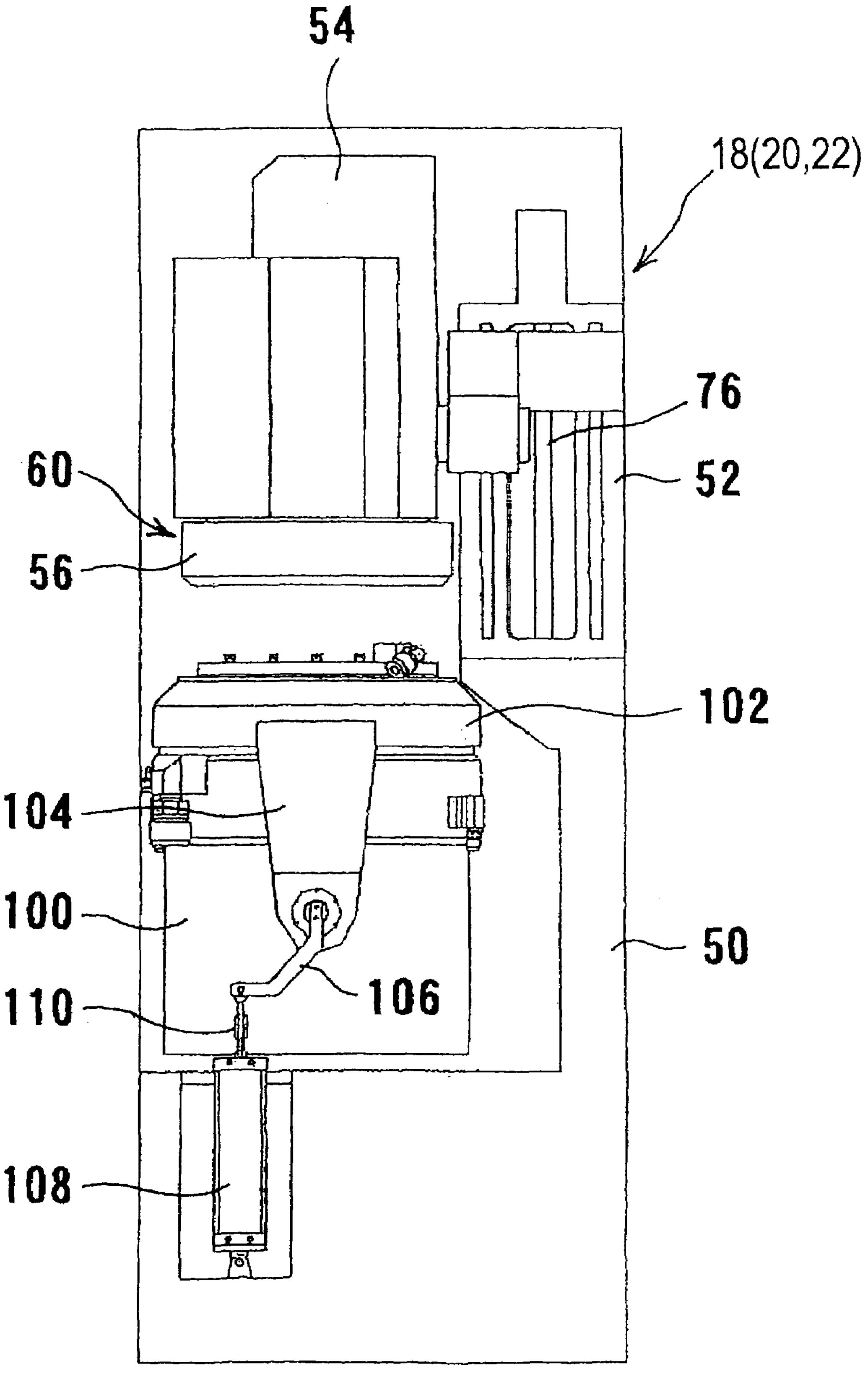

F I G. 1 6
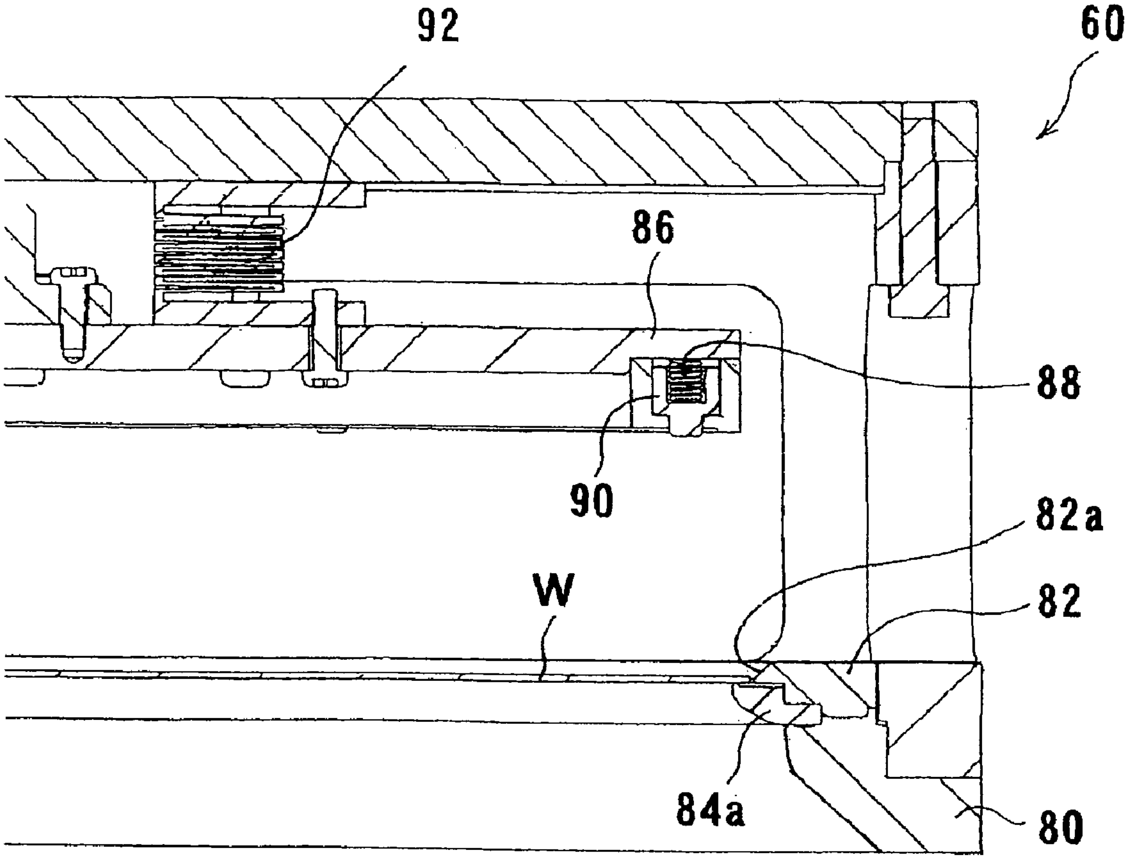

F/G. 17
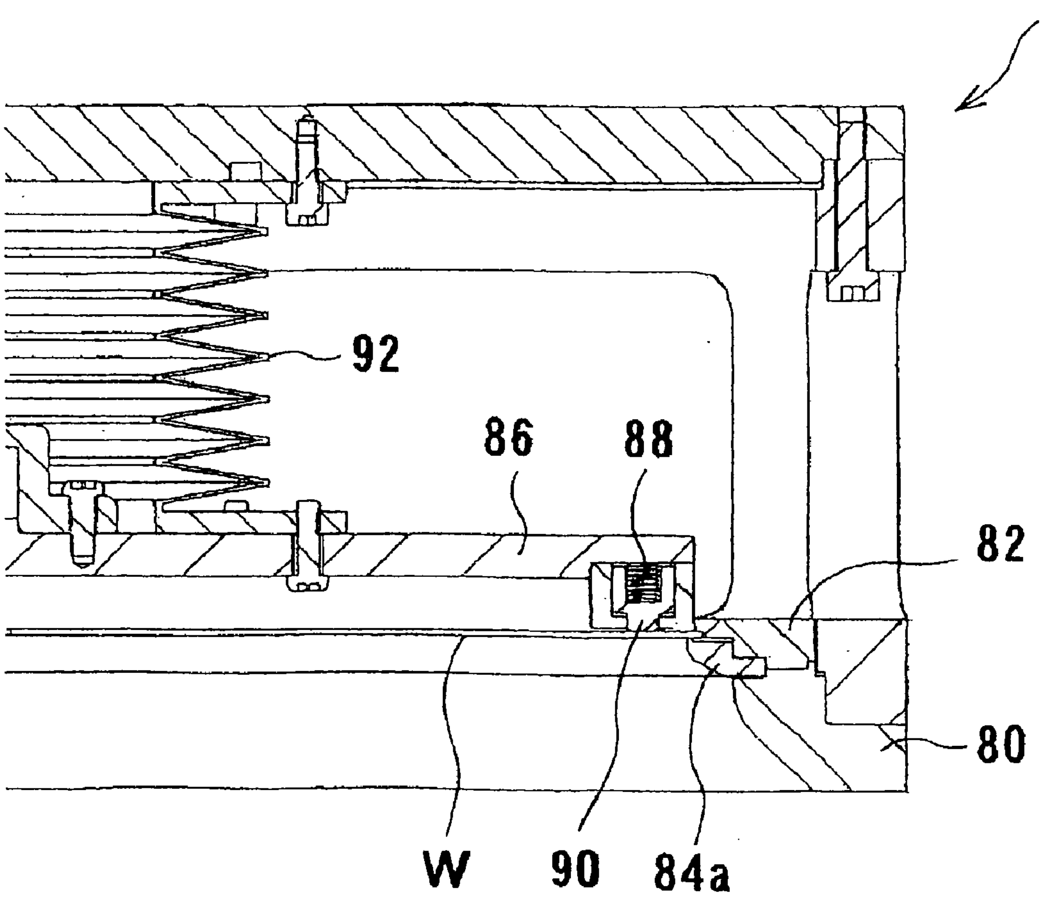

F I G. 1 9
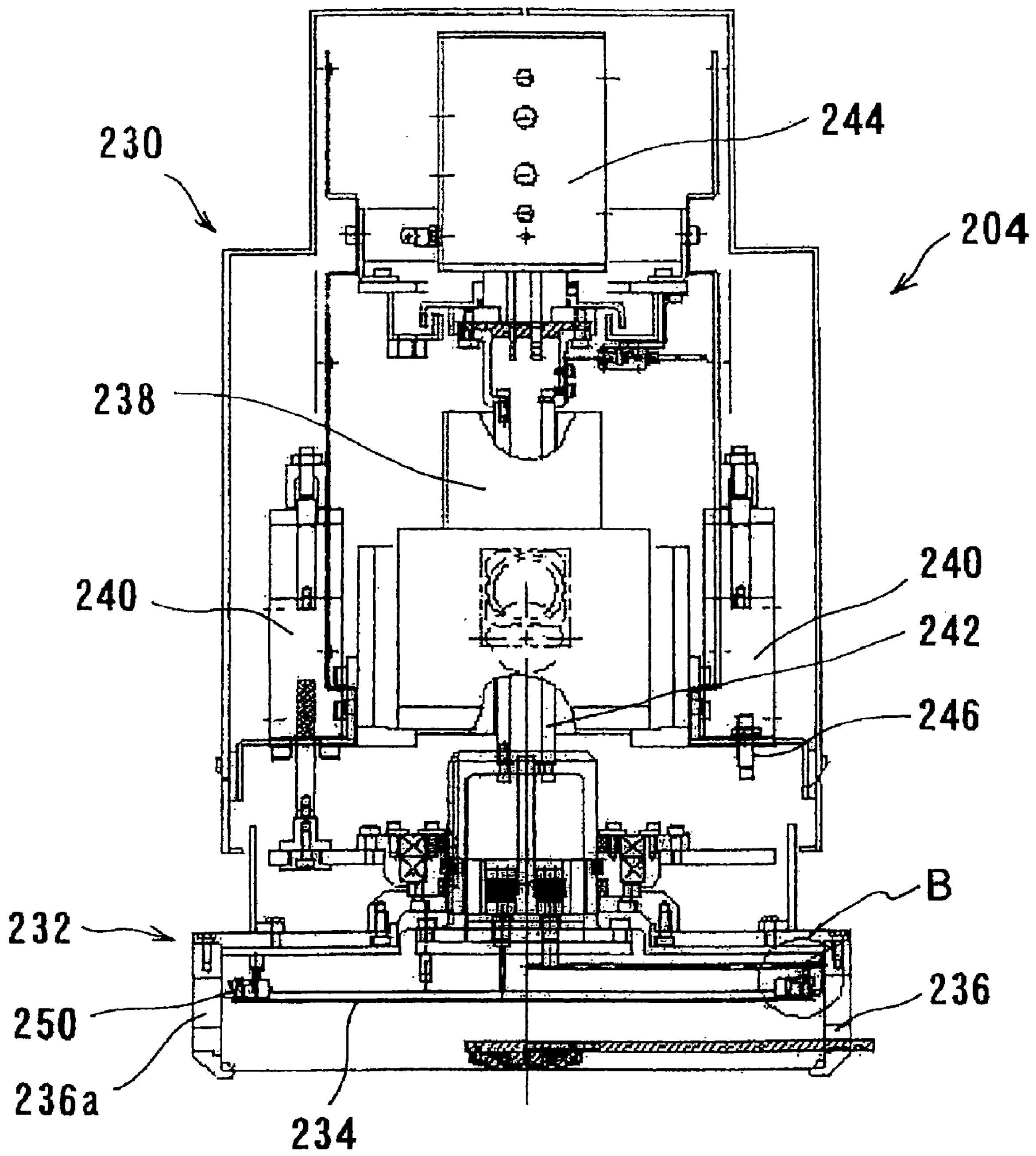

F I G. 2 0
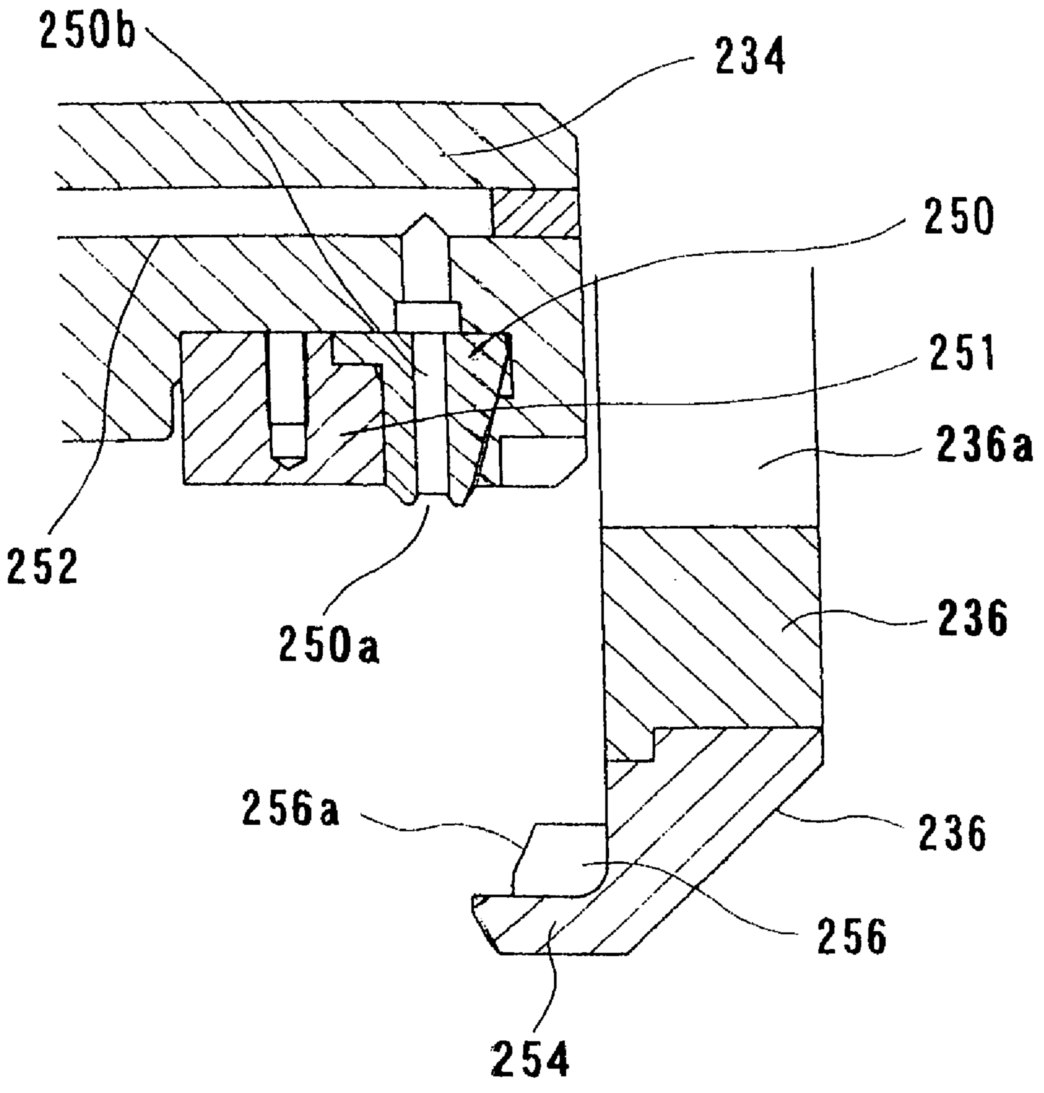

F I G. 2 1
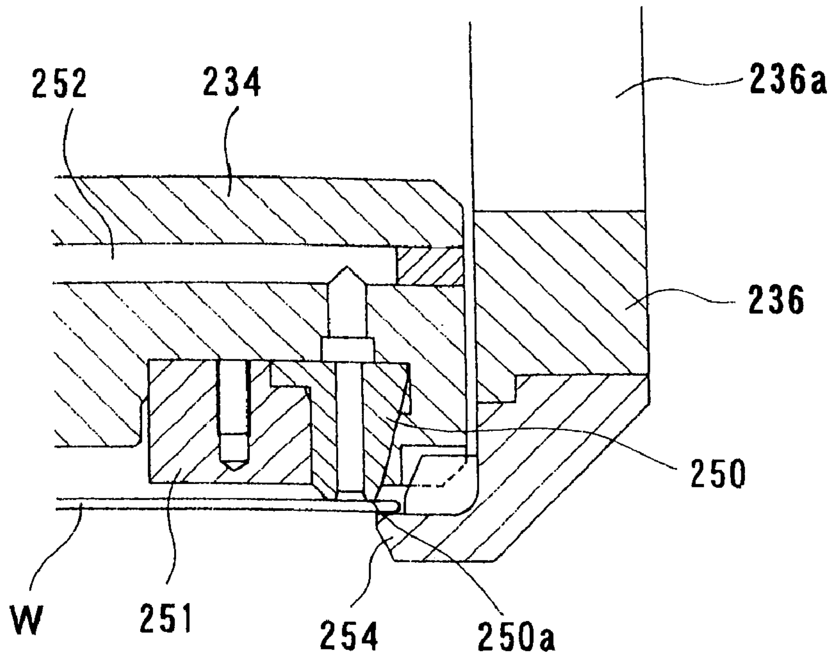
F I G. 2 2
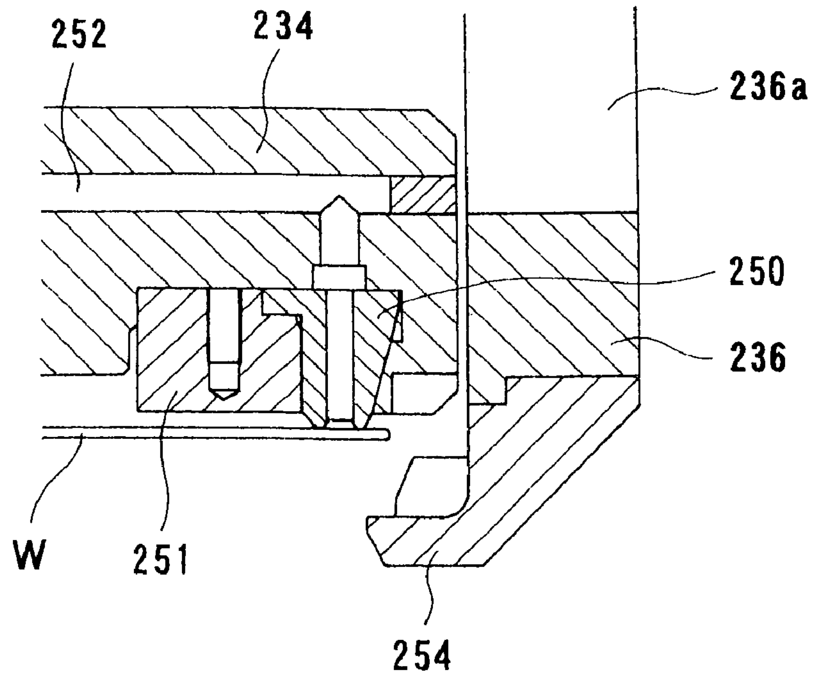

F I G. 2 3
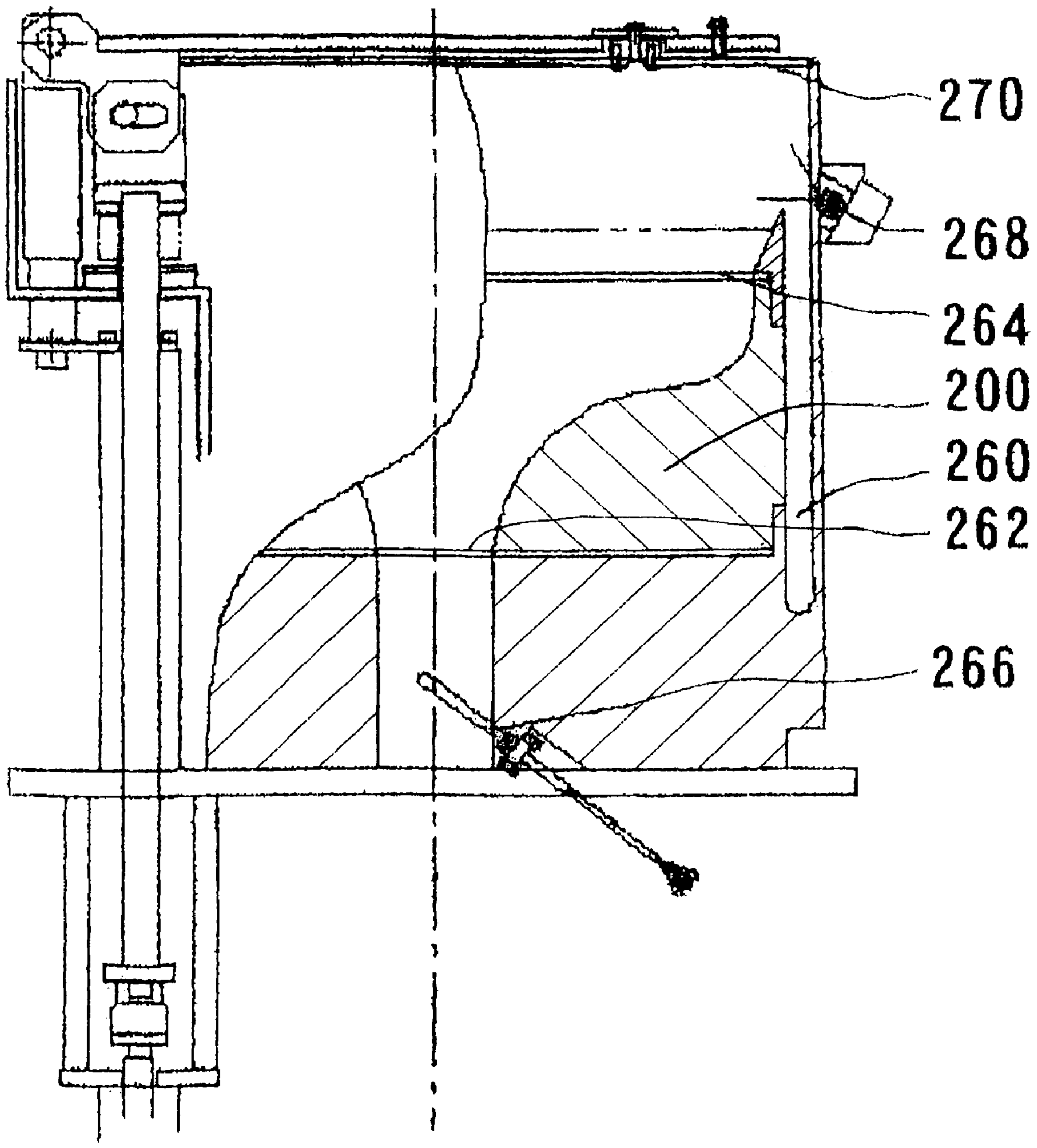

F I G. 2 4
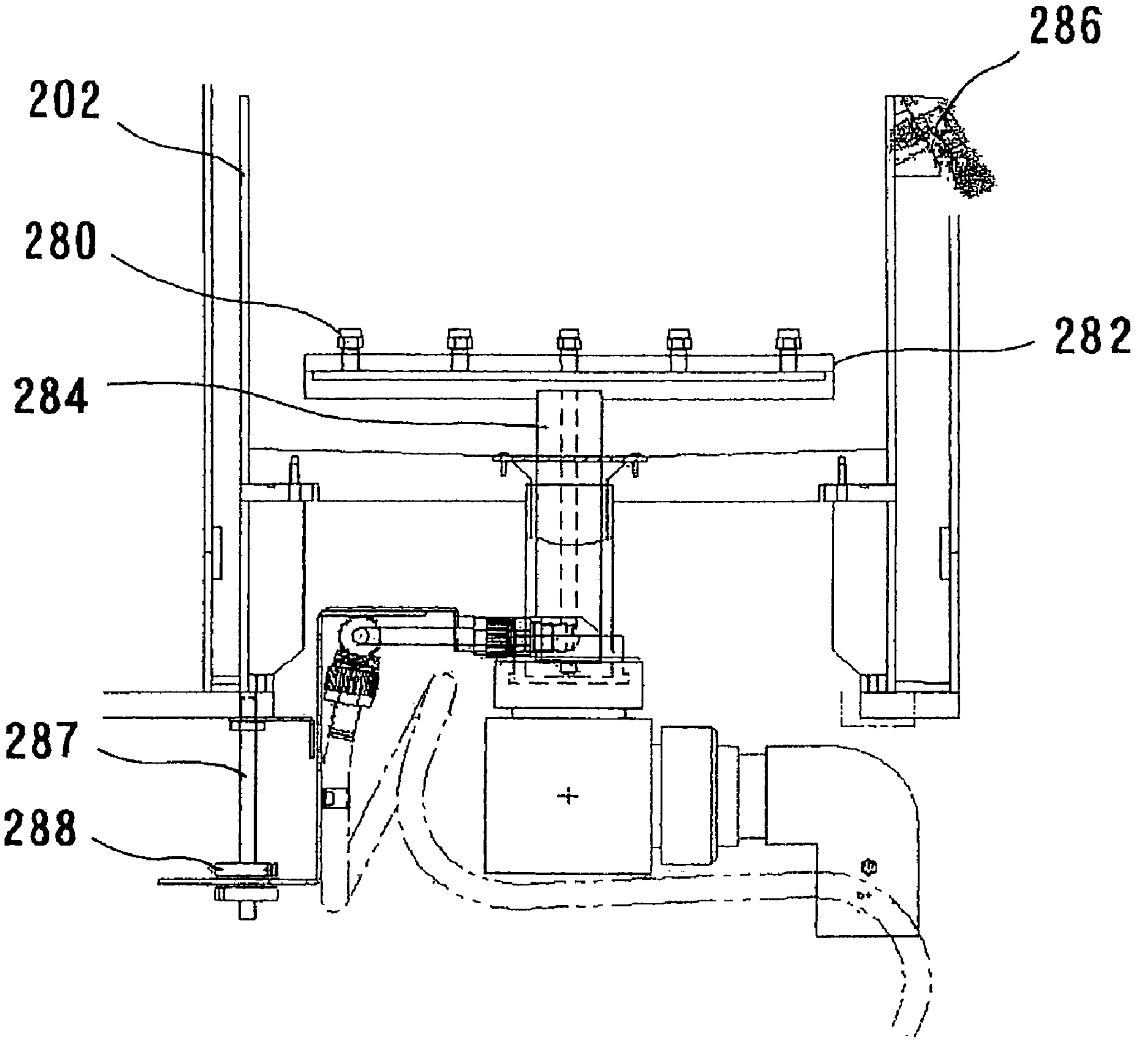

*F I G. 2 5*
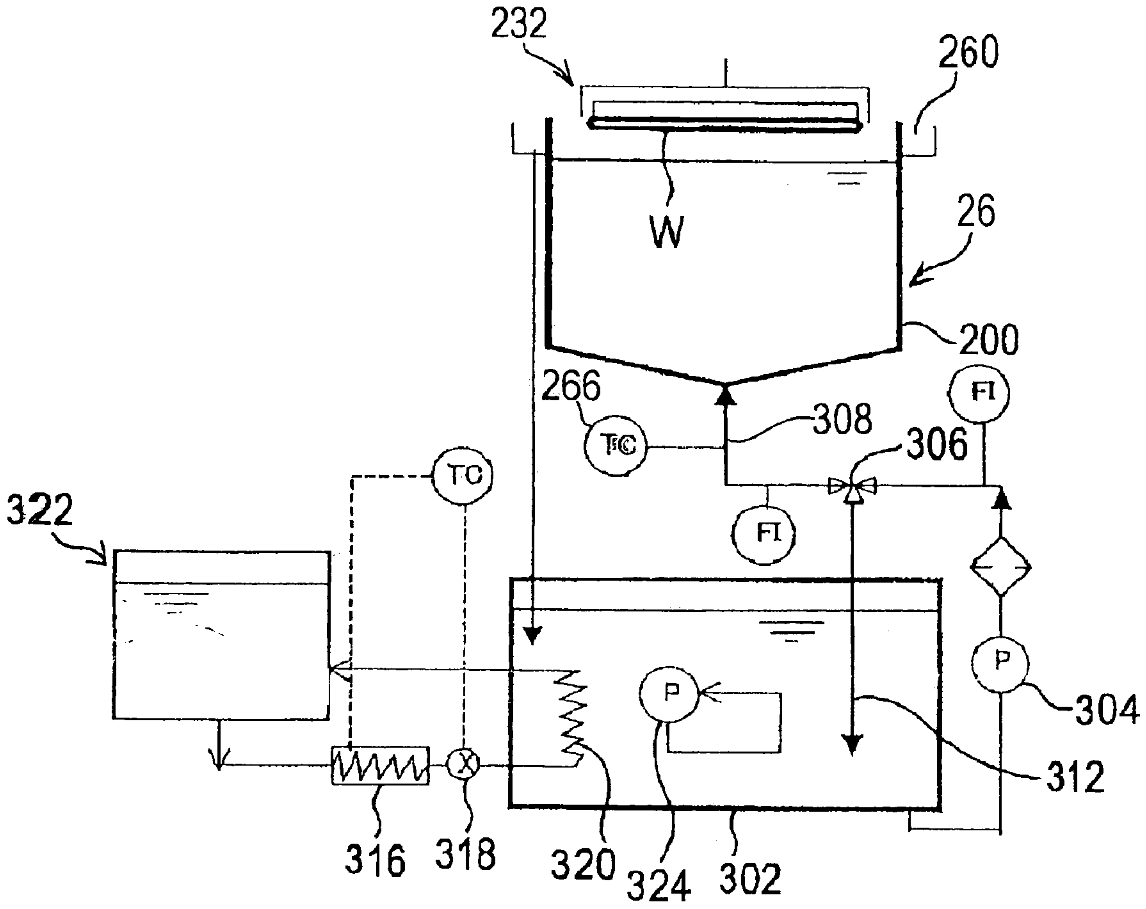

F I G. 2 7
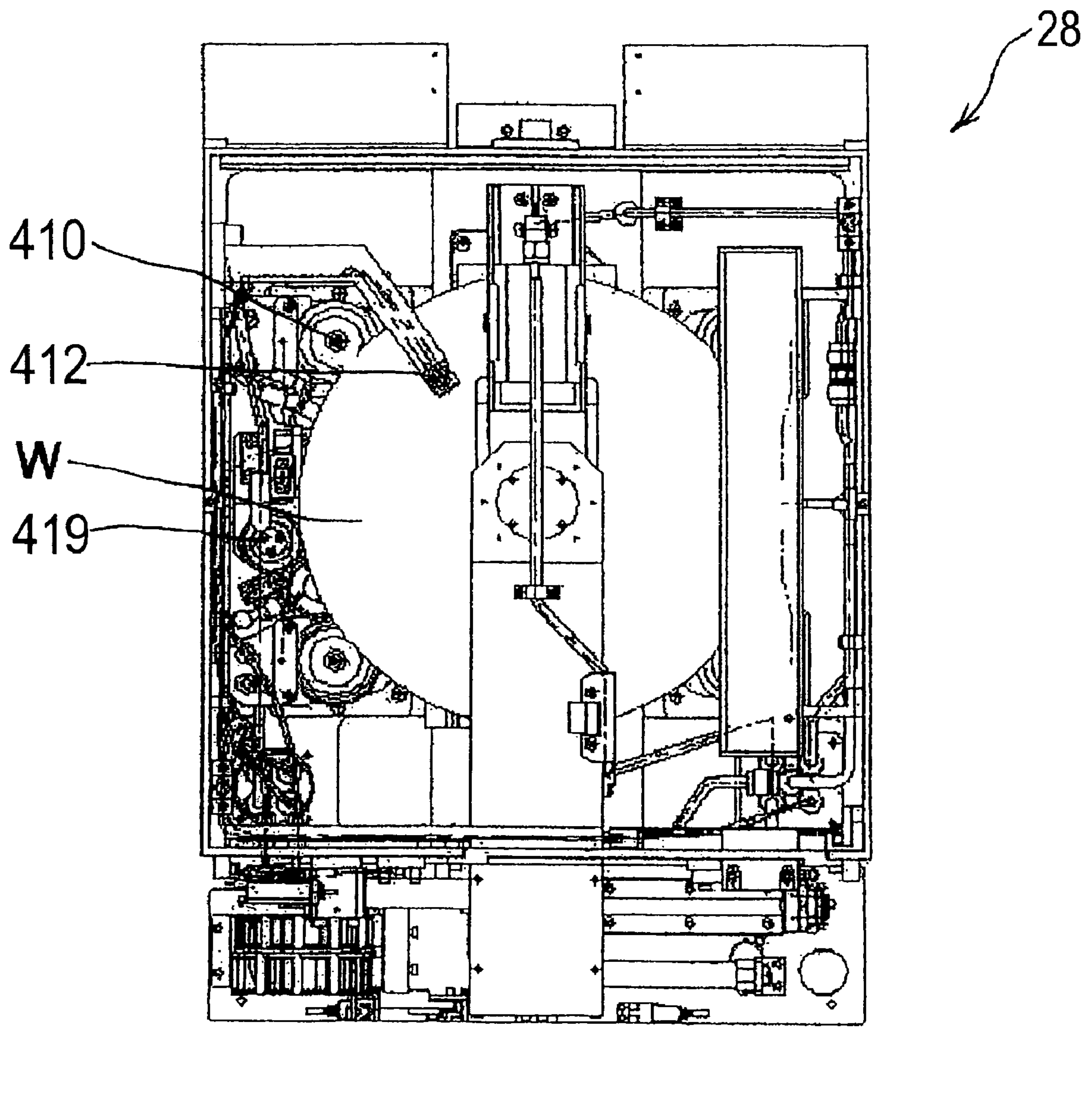

F I G. 28
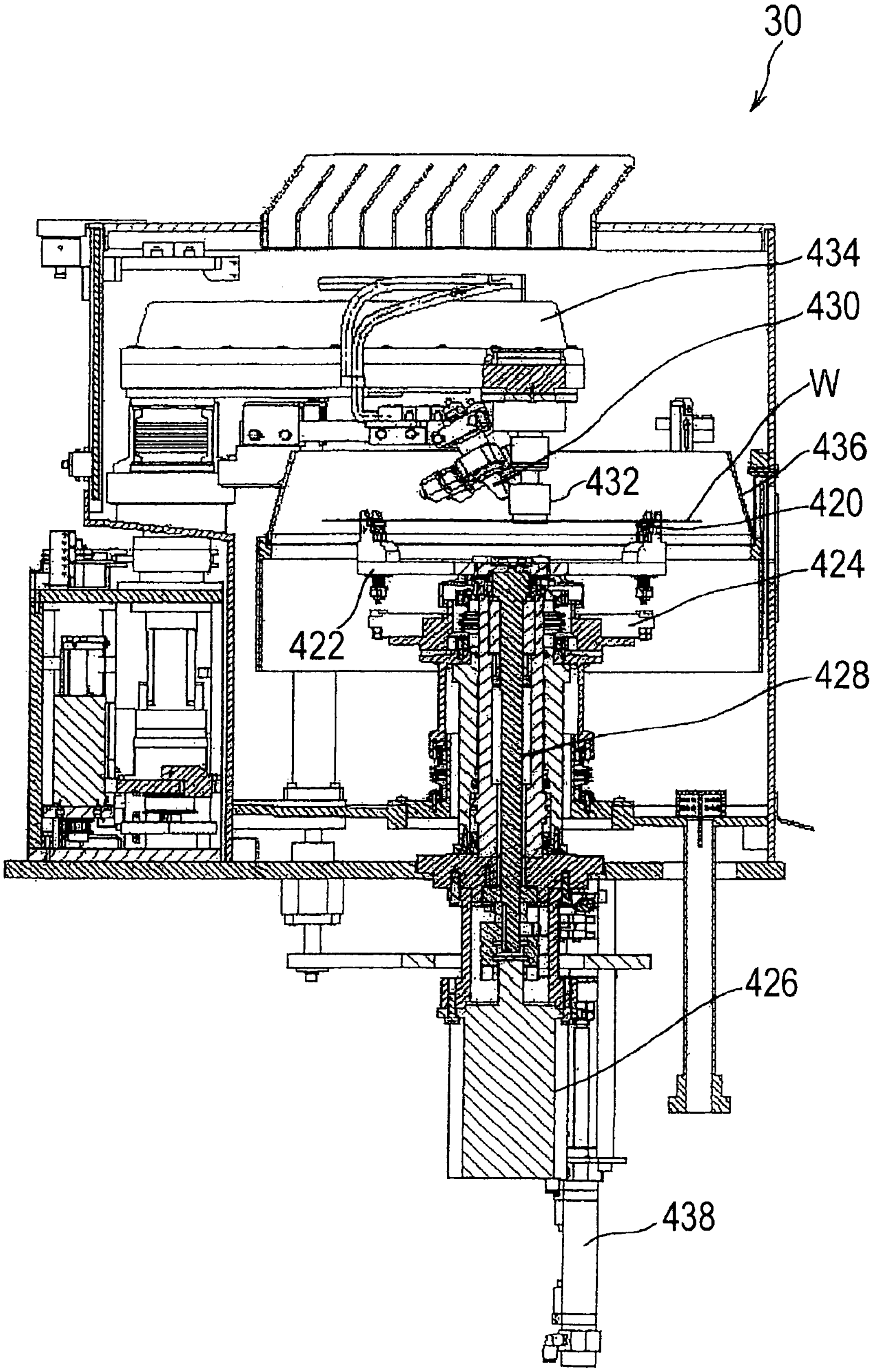

PLATING METHOD INCLUDING PRETREATMENT OF A SURFACE OF A BASE METAL

BACKGROUND OF THE INVENTION

1. Field of the Invention

The present invention relates to a plating method and a plating apparatus, and more particularly to a plating method and a plating apparatus which are useful for forming a protective film by electroless plating selectively on the exposed surfaces of embedded interconnects of an interconnect material, such as copper or silver, embedded in interconnect recesses provided in the surface of a substrate, such as a semiconductor wafer, so as to cover and protect the interconnects with the protective film.

The present invention also relates to an interconnects-forming method useful for forming embedded interconnects by embedding an interconnect material, such as copper or silver, in interconnect recesses provided in a surface of a substrate, such as a semiconductor wafer, and covering the surfaces of the embedded interconnects with a protective film to make a multi-level structure.

2. Description of the Related Art

As a process for forming interconnects in a semiconductor substrate, a so-called "damascene process", which comprises embedding an interconnect material (metal) into trenches and via holes, is coming into practical use. According to this process, aluminum, or more recently an interconnect material (metal) such as silver or copper, is embedded into interconnect recesses, such as trenches and via holes, previously formed in an interlevel dielectric layer. Thereafter, an extra metal is removed by performing chemical-mechanical polishing (CMP) so as to flatten a surface of the substrate.

In a case of interconnects formed by such a process, for example, copper interconnects formed by using copper as an interconnect material, embedded interconnects of copper have exposed surfaces after the flattening processing. In order to prevent thermal diffusion of such interconnects (copper), or to prevent oxidation of such interconnects (copper) e.g. during forming thereon an insulating film (oxide film) under an oxidizing atmosphere to produce a semiconductor substrate having a multi-layer interconnect structure, it is now under study to selectively cover the exposed surfaces of interconnects with an protective film (cap material) composed of a Co alloy, a Ni alloy or the like so as to prevent thermal diffusion and oxidation of the interconnects. Such an protective film of a Co alloy, a Ni alloy or the like can be produced e.g. by performing electroless plating.

FIGS. 1A through 1D illustrate, in sequence of process steps, an example of forming copper interconnects in a semiconductor device. As shown in FIG. 1A, an insulating film (interlevel dielectric layer) 2, such as an oxide film of $SiO_2$ or a film of low-k material, is deposited on a conductive layer 1*a* formed on a semiconductor base 1 having formed semiconductor devices. Via holes 3 and trenches 4 are formed in the insulating film 2 by performing a lithography/etching technique so as to provide interconnect recesses. Thereafter, a barrier layer 5 of TaN or the like is formed on the insulating film 2, and a seed layer 6 as a feeding layer for electroplating is formed on the barrier layer 5 by sputtering or the like.

Then, as shown in FIG. 1B, copper plating is performed on a surface of a substrate W to fill the via holes 3 and the trenches 4 of the substrate W with copper and, at the same time, deposit a copper film 7 on the insulating film 2. Thereafter, the barrier layer 5, the seed layer 6 and the copper film 7 on the insulating film 2 are removed by chemical-mechanical polishing (CMP) or the like so as to leave copper filled in the via holes 3 and the trenches 4, and have a surface of the insulating film 2 lie substantially on the same plane as this copper. Interconnects (copper interconnects) 8 composed of the seed layer 6 and the copper film 7 are thus formed in the insulating film 2, as shown in FIG. 1C.

Then, as shown in FIG. 1D, electroless plating is performed on a surface of the substrate W to selectively form a protective film 9 of a Co alloy, a Ni alloy or the like on surfaces of the interconnects 8, thereby covering and protecting the surfaces of the interconnects 8 with the protective film 9.

There will be described a process of forming a protective film (cap material) 9 of, for example, a CoWP alloy film selectively on surfaces of interconnects 8 by using a general electroless plating method. First, a substrate such as a semiconductor wafer after CMP processing is immersed in e.g. an aqueous $H_2SO_4$ solution to etch away e.g. copper oxide on interconnects 8, thereby activating surfaces of interconnects 8. After the surface of the substrate W is cleaned with a cleaning liquid such as pure water, if necessary, the substrate W is immersed, for example, in a $PdCl_2/HCl$ mixed solution to adhere Pd as a catalyst to the surfaces of the interconnects 8. After the surface of the substrate W is cleaned (rinsed) with pure water or the like, the substrate W is immersed, for example, in a CoWP plating solution to carry out electroless plating selectively on surfaces of the Pd adhered interconnects 8. Thereafter, the surface of the substrate W is cleaned with a cleaning liquid such as pure water. Thus, a protective film 9 made of a CoWP alloy film is formed selectively on the exposed surfaces of interconnects 8 so as to protect interconnects 8.

The application of a catalyst such as Pd, in principle, is effected through a displacement reaction caused by electrons ($e^-$) that are emitted from interconnects (base metal) upon etching thereof, i.e. through the so-called "displacement plating". The catalyst application involves the problem that interconnects as a base metal can be etched excessively especially at weak crystal grain boundaries. The excessive etching in interconnects may result in the formation of voids in the interconnects, which would lower the reliability of the interconnects and increase the resistance of the interconnects. This has led to difficulty in establishing a practical process.

This problem will be explained taking as an example the case of forming a copper film 502, constituting interconnects 8 (see FIG. 1C), on the surface of a barrier layer 500 of TaN, and forming a protective film 504 of a CoWP alloy on the surface of the copper film 502 by electroless plating, as schematically shown in FIGS. 2A through 2D.

The copper film 502 is a polycrystalline film having a plurality of crystalline orientations and comprising a large number of copper crystal grains 502*a* which are considered to be linked planewise to each other at crystal grain boundaries 502*b*, as shown in FIG. 2A. The surface of the copper film 502 is immersed in e.g. an aqueous $H_2SO_4$ solution to etch away copper oxide (CuO) present in the surface of the copper film 502 with $H_2SO_4$, thereby activating the surface, as shown by the following formula (1). Upon the etching, as shown in FIG. 2B, the copper film 502 is etched and removed excessively at the upper portions of the crystal grain boundaries 502*b* between adjacent copper crystal grains 502*a*, resulting in the formation of recesses 506.

$$CuO+H_2SO_4 \rightarrow CuSO_4+H_2O \quad (1)$$

When the surface of the copper film 502 is subsequently immersed in e.g. a $PdSO_4/H_2SO_4$ mixed solution to form a Pd catalyst layer 508, comprising Pd as a catalyst, on the surface of the copper film 502, copper is etched excessively along the weak crystal grain boundaries 502 especially and electrons are emitted from the copper, as shown by the following formula (2). At the surfaces of the copper crystal grains 502*a*, $Pd^{2+}$ ions receive the electrons whereby the Pd catalyst layer is formed, as shown by the following formula (3). The additional excessive etching of copper along the crystal grain boundaries 502*b* results in the formation of voids 510, as shown in FIG. 2C.

$$Cu \rightarrow Cu^{2+} + 2e^{-} \quad (2)$$

$$Pd^{2+} + 2e^{-} \rightarrow Pd \quad (3)$$

When a protective film 504 of a CoWP alloy is subsequently formed by electroless plating on the surface of the copper film 502, the voids 510 remain within the copper film (interconnects) 502 covered with the protective film 504. Further, in principle, a liquid remains in the voids 510. Upon a heat treatment which is necessary for the production of interconnects, the liquid remaining in the voids 510 will expand, leading to the growth of the voids 510.

The application of a catalyst such as Pd to a copper surface is requisite for forming a CoWP alloy film on the copper surface by electroless plating. A CoWP alloy film is in no case deposited directly on a copper surface by electroless plating.

There is a case where upon the formation of a protective film by electroless plating onto interconnects of a substrate after removal of an extra metal on the substrate and flattening of the substrate surface by CMP, the pattern dependency of the interconnects and the protective film associated with the rate limitation of the supply of reaction species, becomes marked whereby the thickness of the protective film formed selectively on the surfaces of the interconnects by electroless plating becomes uneven. This may lead to a failure in obtaining a stable interconnects-forming process and a lowering of the throughput.

In particular, upon the selective formation of a protective film on interconnects by electroless plating, a thickness of the protective film is likely to vary due to a variation in the density of the interconnects. Such an uneven film cannot fully function as a protective film. Further, especially for an isolated narrow interconnect pattern, there may exist a transition time until the initiation of plating reaction, whereby the plating cannot be deposited with ease.

Consider now a case where a first interconnect pattern, for example, comprising isolated interconnects (narrow interconnects) 8 having a width of 0.25 μm arranged at intervals of 10 μm as shown in FIG. 3A, a second interconnect pattern, for example, comprising interconnects (narrow interconnects) 8 having a width of 0.25 μm density arranged at intervals of 0.25 μm as shown in FIG. 3B, and a third interconnect pattern, for example, comprising isolated interconnects (broad interconnects) 8 having a width of 10 μm arranged at intervals of 1 μm as shown in FIG. 3C, are co-present in a surface of a substrate.

Polishing and removal of copper by CMP is generally carried out by oxidizing the copper and polishing away the copper oxide. Accordingly, when the above substrate having a variety of interconnect patterns is subjected to the above-described process comprising embedding of copper as an interconnect material, followed by CMP to remove an unnecessary metal on an insulating film and flatten the surface, oxide films 8*a* are formed in the upper portions of the interconnects 8 which are formed in trenches 4, covered with a barrier layer 5, provided in an insulating film 2, as shown in FIGS. 3A through 3C. The thickness of the respective oxides 8*a* of the various interconnect patterns differ from one another due to a difference in reaction produced by the rate limitation of the supply of reaction species. In particular, a relatively thick oxide film 8*a* having a thickness of e.g. about 10 nm is formed in the first interconnect pattern, as shown in FIG. 3A. An oxide film 8*a* having an intermediate thickness of e.g. about 6 nm is formed in the second interconnect pattern, as shown in FIG. 3B. And in the third interconnect pattern, a relatively thin oxide film 8*a* having a thickness of e.g. about 4 nm is formed, as shown in FIG. 3C.

When the substrate is subjected to a pre-electroless plating treatment to remove the oxide films 8*a* formed in the upper portions of interconnects 8, spaces 10 having heights equal to the thicknesses of the corresponding oxide films 8*a* removed are formed in the trenches 4, as shown in FIGS. 4A through 4C. Thus, a space 10 having a height of e.g. about 10 nm is formed in the first interconnect pattern, as shown in FIG. 4A. A space 10 having a height of e.g. about 6 nm is formed in the second interconnect pattern, as shown in FIG. 4B. And in the third interconnect pattern, a space 10 having a height of e.g. 4 nm is formed, as shown in FIG. 4C.

When the substrate is subsequently subjected to electroless plating to form a protective film 9 of e.g. a NiB alloy selectively on the surfaces of the interconnects 8, the thickness of the protective film 9 varies depending on the interconnect pattern configuration, due to a difference in reaction produced by the rate limitation of the supply of reaction species, as shown in FIGS. 5A through 5C. In particular, a protective film 9 having a thickness of e.g. about 10 nm (FIG. 5A) is formed in the first interconnect pattern. A protective film 9 having a thickness of e.g. about 6 nm (FIG. 5B) is formed in the second interconnect pattern. And in the third interconnect pattern, a protective film 9 having a thickness of e.g. about 4 nm (FIG. 5C) is formed. As in this case, the narrower and the more isolated interconnects are, a protective film formed on the exposed surfaces of interconnects tends to be thicker.

The interconnect pattern dependency of the thickness of a protective film is due to a difference in reaction produced by the rate limitation of the supply of reaction species. In particular, for an interconnect pattern comprising a single interconnect (reaction region) 8 having a surface area of 2×10 in a region (surface area) of 10×10, as shown in FIG. 6A, the ratio of the reaction region to the whole region is 0.2 (20/100). For an interconnect pattern comprising two interconnects (reaction regions) each having a surface area of 2×10 in a region of 10×10, as shown in FIG. 6B, the ratio of the reaction regions to the whole region is 0.4 (2×20/100). Further, for an interconnect pattern comprising a single interconnect (reaction region) 8 having a surface area of 5.2×10 in a region of 10×10, as shown in FIG. 6C, the ratio of the reaction region to the whole region is 0.52 (52/100). Thus, the larger the ratio of the reaction region (area) to the whole region (area) is, the thinner oxide film 8*a* is formed in the upper portions of interconnects 8 upon CMP, resulting in the formation of a thinner protective film 9.

Further, an insulating film (interlevel dielectric layer), for example composed of $SiO_2$, surrounding embedded interconnects generally has a poor thermal conductivity. In addition, the plating rate in electroless plating is influenced largely by a temperature factor. FIG. 7 shows the relationship between the plating rate and the liquid temperature of plating solution in electroless CoWB plating. As can be seen from FIG. 7, the plating deposition is impossible at the liquid temperature of 52° C. or lower and, in the liquid temperature range of 55-70° C., the temperature difference of 1° C. produces a difference of about 1.3 nm/min in the plating rate.

Accordingly, when a substrate, after carrying out the pre-plating treatment shown in FIGS. 4A through 4C, is subjected to electroless plating, for example, using an electroless CoWB plating solution at a liquid temperature of 60° C. to form a protective film 9 of a CoWB alloy on the surfaces of interconnects 8, a relatively thin protective film 9 is formed in the first interconnect pattern, as shown in FIG. 8A. A relatively thick protective film 9 is formed in the second interconnect pattern, as shown in FIG. 8B. And in the third interconnect pattern, a protective film 9 having an intermediate thickness is formed, as shown in FIG. 8C. Thus, the narrower and the more isolated interconnects are, a protective film formed on the exposed surfaces of interconnects tends to be thinner due to a shortage of heat capacity.

SUMMARY OF THE INVENTION

The present invention has been made in view of the above situation in the related art. It is therefore a first object of the present invention to provide a plating method and a plating apparatus which can securely form a metal film (protective film) by electroless plating on the exposed surfaces of a base metal, such as interconnects without the formation of voids in the base metal.

It is a second object of the present invention to provide an interconnects-forming method which can form a protective film having a uniform thickness over the entire surface of a substrate without being influenced by local differences in interconnect pattern configuration and in heat capacity in the substrate.

In order to achieve the above objects, the present invention provides a plating method comprising: carrying out pretreatment of a surface of a base metal with a pre-treatment liquid containing a surface activating agent for the base metal and an excessive etching inhibitor for the base metal; and forming a metal film by electroless plating on the surface of the base metal after the pretreatment.

According to this plating method, a base metal is pretreated with a pre-treatment liquid containing a surface activating agent for the base metal and an excessive etching inhibitor for the base metal. If the upper portions of weak crystal grain boundaries between adjacent crystal grains are selectively etched by the surface activating agent contained in the treatment liquid and recesses are formed consequently, the recesses can be filled with the excessive etching inhibitor simultaneously with their formation, thereby preventing the growth of voids.

The surface activating agent for the base metal is, for example, an inorganic acid, an organic acid, an inorganic alkali or an organic alkali. Examples of the inorganic acid include $H_2SO_4$, HCl, $HNO_3$, HF, etc. Examples of the organic acid include a carboxylic acid such as formic acid, an alkanesulfonic acid, etc. Examples of the inorganic alkali include ammonia water, etc. Examples of the organic alkali include choline, TMAH, etc.

The present invention provides another plating method comprising: carrying out catalytic treatment of a surface of a base metal with a catalytic treatment liquid containing catalyst metal ions and an excessive etching inhibitor for the base metal; and forming a metal film by electroless plating on the surface of the base metal after the catalytic treatment.

According to this plating method, a base metal is subjected to a catalytic treatment with a catalytic treatment liquid containing catalyst metal ions and an excessive etching inhibitor for the base metal. When the catalyst ions become the metal and the metal is carried on (replaced with) the surfaces of interconnects, the excessive etching inhibitor can inhibit excessive etching of the weak crystal grain boundaries between adjacent crystal grains, thus preventing the formation of voids along the crystal grain boundaries.

Examples of the catalyst metal ions may include Pd ions, Sn ions, Ag ions, Pt ions, Au ions, Cu ions, Co ions and Ni ions. Of these metal ions, the use of Pd ions is particularly preferred from the viewpoints of the reaction rate, case of control, etc.

Preferably, the catalytic treatment liquid further contains a supporting electrolyte. The supporting electrolyte is, for example, an inorganic acid, an organic acid, an inorganic alkali or an organic alkali. Examples of the inorganic acid include $H_2SO_4$, HCl, $HNO_3$, HF, etc. Examples of the organic acid include a carboxylic acid such as formic acid, an alkanesulfonic acid, etc. Examples of the inorganic alkali include ammonia water, etc. Examples of the organic alkali include choline, TMAH, etc.

The excessive etching inhibitor for the base metal is preferably a compound having an atom chemically adsorptive to the base metal. Chemical adsorption refers to adsorption that occurs at the interface between two phases by the action of a chemical bonding force between molecules of the first phase (adsorbate) and the surface of the second phase (adsorbent).

The atom chemically adsorptive to the base metal is, for example, N atom. N atom-containing cyclic organic compounds include benzotriazole, pyrazole, imidazole and benzimidazole. Benzotriazole, which is a common inhibitor for copper, is an N atom-containing chemically adsorptive material, having the below-described chemical formula, which is adsorbed onto surface activated points of copper. Benzotriazole is generally employed especially as an antioxidant.

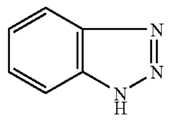

The excessive etching inhibitor for the base metal is preferably a compound having an amine structure. Examples of the (organic) compound having an amine structure include methylamine, ethylamine, dimethylamine, N,N-dimethylaniline and diphenylamine.

In a preferred embodiment of the present invention, the base metal after the catalytic treatment is post-treated with a post-treatment liquid containing a component for removing an excess of the excessive etching inhibitor for the base metal. This can prevent the excessive etching inhibitor for the base metal from remaining on the surface of the base metal and adversely affecting the later plating process or the like.

The post-treatment liquid is, for example, an alkali solution. The alkali may be an organic alkali, such as TMAH or cholin, or an inorganic alkali, such as $NH_3OH$, NaOH or KOH.

In a preferred embodiment of the present invention, the substrate is a semiconductor device having an embedded interconnect structure, with its exposed interconnects constituting the base metal, and the metal film as a protective film is formed by electroless plating selectively on the surfaces of the base metal.

By thus applying the present plating method to a semiconductor device having an embedded interconnect structure, it becomes possible to selectively cover the exposed surfaces of interconnects with a metal film (protective film) to protect the interconnects without the formation of voids in the interconnects.

The interconnects of the semiconductor device having an embedded interconnect structure are, for example, composed of Cu, a Cu alloy, Ag or an Ag alloy.

The metal film as a protective film is, for example, composed of CoWP, CoWB, CoP, CoB, a Co alloy, NiWP, NiWB, NiP, NiB or a Ni alloy.

The present invention provides still another plating method comprising: providing a semiconductor device having an embedded interconnect structure; carrying out pretreatment of interconnects with a pre-treatment liquid containing a surface activating agent for the interconnects; carrying out catalytic treatment of the interconnects with a catalytic treatment liquid containing catalyst metal ions and an excessive etching inhibitor for the interconnects; and forming a protective film by electroless plating selectively on the surfaces of the interconnects.

The present invention provides a plating apparatus comprising: a pre-treatment unit for carrying out pretreatment of a surface of exposed interconnects of a semiconductor device having an embedded interconnect structure with a pre-treatment liquid containing a surface activating agent for the interconnects; a catalytic treatment unit for carrying out catalytic treatment of the interconnects after the pretreatment with a catalytic treatment liquid containing catalyst metal ions and an excessive etching inhibitor for the interconnects; and an electroless plating unit for forming a protective film selectively on the surfaces of the interconnects after the catalytic treatment.

In the preferred embodiment of the present invention, the plating apparatus further comprises a post-catalyzation treatment unit for carrying out a post-treatment after the catalytic treatment with a post-treatment liquid containing a component for removing an excess of the excessive etching inhibitor for the base metal.

The present invention provides an interconnects-forming method comprising: forming embedded interconnects in a surface of a substrate while suppressing interconnect pattern dependency due to the rate limitation of the supply of reaction species; and forming a protective film selectively on the exposed surfaces of the embedded interconnects while suppressing interconnect pattern dependency due to the rate limitation of the supply of reaction species.

This interconnects-forming method makes it possible to stably form a protective film, having a uniform thickness over the entire surface of a substrate, on the surfaces of interconnects without being influenced by local differences in interconnect pattern configuration in the substrate.

The present invention provides another interconnects-forming method comprising: forming interconnect recesses, conforming to the configuration of an interconnect pattern, in an insulating film superimposed on a substrate; forming dummy recesses, conforming to the configuration of a dummy pattern constituting a reaction region, in the insulating film; embedding an interconnect material in the interconnect recesses and the dummy recesses; removing an extra metal on the insulating film and flattening the substrate surface; and forming a protective film selectively on the surfaces of the interconnect material embedded in the interconnect recesses and the dummy recesses.

According to this interconnects-forming method, a dummy pattern, constituting a reaction region, can be provided at a desired location, for example, in the vicinity of an isolated narrow interconnect, thereby increasing the local reaction region. Accordingly, the thickness of an oxide film formed in the upper portion of interconnects upon removal of an extra metal on a substrate and flattening of the substrate surface by CMP or the like and the thickness of a protective film formed by electroless plating can be made uniform, without depending on the interconnect pattern configurations over the entire surface of the substrate.

In a preferred embodiment of the present invention, the dummy pattern is provided in such a manner that the surface area per unit area of the sum of the dummy pattern and the interconnect pattern becomes uniform over the entire surface of the substrate.

Thus, the reaction region consisting of the interconnect pattern and the dummy pattern can be made uniform over the entire surface of the substrate.

In a preferred embodiment of the present invention, the embedding of the interconnect material is carried out by electroplating and/or electroless plating, the flattening of the substrate surface is carried out by CMP, and the formation of the protective film is carried out by electroless plating.

The present invention provides still another interconnects-forming method comprising: forming embedded interconnects in a surface of a substrate; and forming a protective film by electroless plating on the exposed surfaces of the embedded interconnects while equalizing the heat capacity in the protective film-forming region.

This interconnects-forming method makes it possible to stably form a protective film, having a uniform thickness over the entire surface of a substrate, on the surfaces of interconnects without being influenced by local differences in heat capacity in the substrate.

The present invention provides still another interconnects-forming method comprising: forming interconnect recesses, conforming to the configuration of an interconnect pattern, in an insulating film superimposed on a substrate; forming dummy recesses, conforming to the configuration of a dummy pattern serving as a heat capacity source, in the insulating film; embedding an interconnect material in the interconnect recesses and the dummy recesses; removing an extra metal on the insulating film and flattening the substrate surface; and forming a protective film selectively on the surface of the interconnect material embedded in the interconnect recesses and the dummy recesses by electroless plating.

According to this interconnects-forming method, a dummy pattern, serving as a heat capacity source, can be provided at a desired location, for example, in the vicinity of an isolated narrow interconnect, thereby increasing the local heat capacity so that the heat capacity upon electroless plating can be equalized over the entire surface of the substrate. This can equalize the thickness of a protective film, which is formed by electroless plating on the surfaces of interconnects, over the entire surface of the substrate.

In a preferred embodiment of the present invention, the dummy pattern is provided in such a manner that the volume per unit area of the sum of the interconnect material embedded in the dummy recesses and the interconnect material embedded in the interconnect recesses becomes uniform over the entire surface of the substrate.

The volume of the interconnect material embedded in the interconnect recesses and in the dummy recesses, which determines the heat capacity upon electroless plating, can be made uniform over the entire surface of the substrate.

BRIEF DESCRIPTION OF THE DRAWINGS

FIGS. 1A through 1D are diagrams illustrating, in sequence of process steps, an example of the formation of interconnects in a semiconductor device;

FIG. 9 is a layout plan of a plating apparatus for carrying out a plating method according to an embodiment of the present invention;

FIG. 10 is a diagram showing the process flow of a plating method according to an embodiment of the present invention as carried out by the plating apparatus shown in FIG. 9;

FIGS. 11A through 11D are diagrams schematically illustrating, in sequence of process steps, the mechanism of prevention of the formation of voids according to the plating method of the present invention;

FIG. 12 is a front view of a pre-treatment unit or a catalytic treatment unit at the time of substrate delivery;

FIG. 14 is a front view of the pre-treatment unit or the catalytic treatment unit at the time of rinsing;

FIG. 16 is an enlarged view of a portion A of FIG. 15;

FIG. 17 is a view of the pre-treatment unit or the catalytic treatment unit when the substrate is fixed, which corresponds to FIG. 16;

FIG. 19 is a cross-sectional view showing a substrate head of an electroless plating unit when a substrate is delivered;

FIG. 20 is an enlarged view of a portion B of FIG. 19;

FIG. 21 is a view of the substrate head of the electroless plating unit when the substrate is fixed, which corresponds to FIG. 20;

FIG. 22 is a view of the substrate head of the electroless plating unit at the time of plating, which corresponds to FIG. 20;

FIG. 23 is a front view showing, in a partially cutaway manner, a plating tank of the electroless plating unit when a plating tank cover is closed;

FIG. 24 is a cross-sectional view showing a cleaning tank of the electroless plating unit;

FIG. 25 is a schematic diagram of the electroless plating unit;

FIG. 27 is a plan view showing the post-treatment unit;

FIG. 28 is a vertical sectional front view showing the drying unit;

DETAILED DESCRIPTION OF THE PREFERRED EMBODIMENTS

Figure 2A:
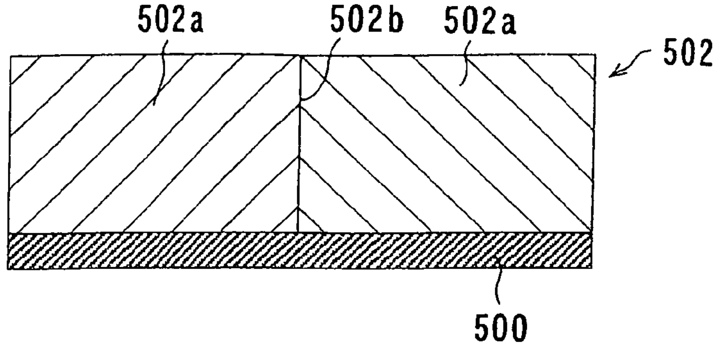
FIGS. 2A through 2D are diagrams schematically illustrating, in sequence of process steps, the mechanism of the formation of voids in a conventional electroless plating.
Figure 2B:
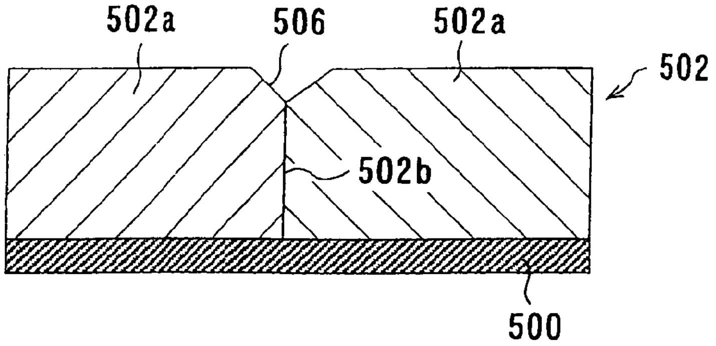
Figure 2C:
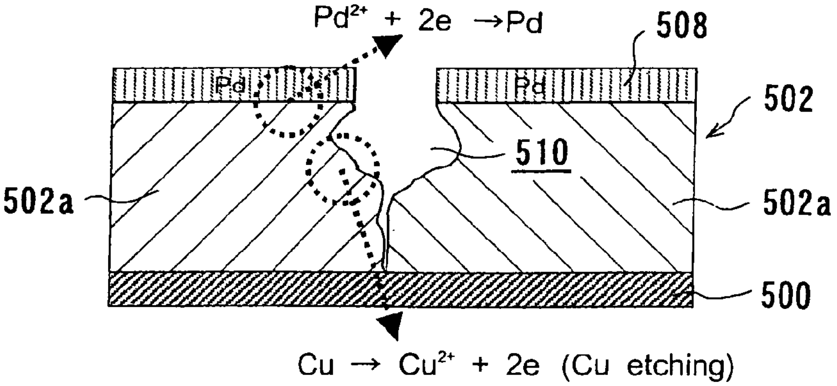
Figure 2D:
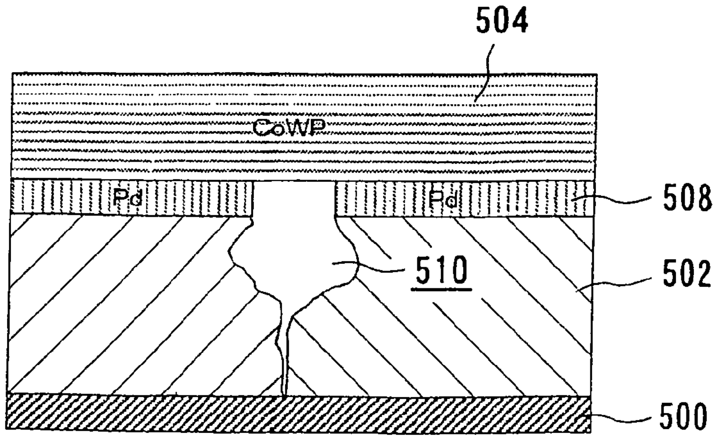
Figures 3A, 3B, 3C:
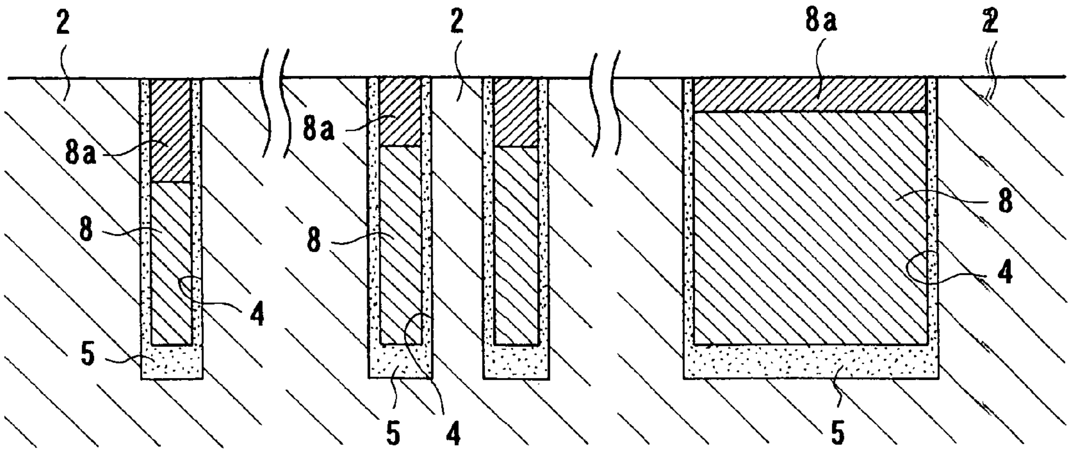
FIGS. 3A through 3C are cross-sectional diagrams of a conventional substrate having a variety of interconnect patterns, showing the state of the substrate after carrying out CMP of the substrate surface.
Figures 4A, 4B, 4C:
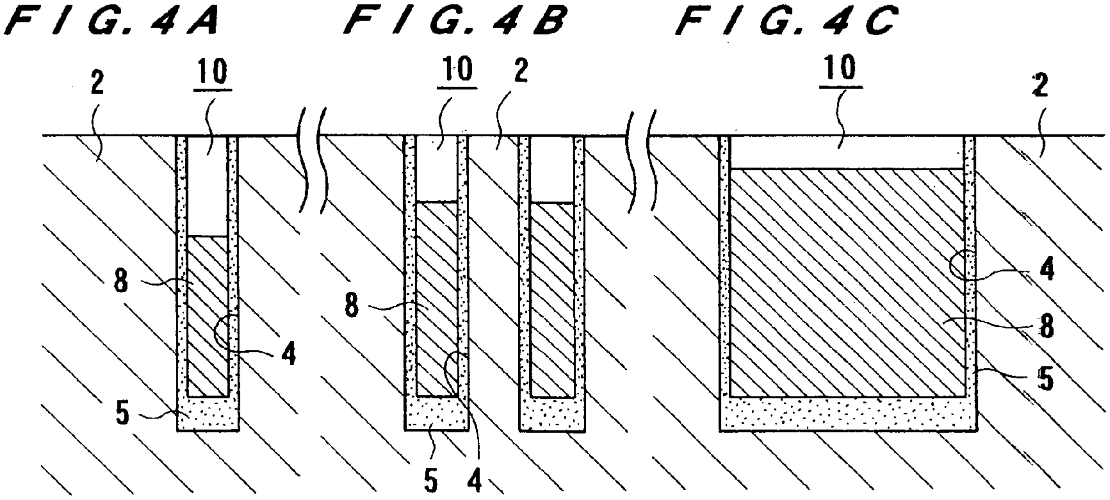
FIGS. 4A through 4C are cross-sectional diagrams showing the state of the same substrate shown in FIGS. 3A through 3C but after carrying out pre-plating treatment of the substrate surface to remove an oxide film.
Figures 5A, 5B, 5C:
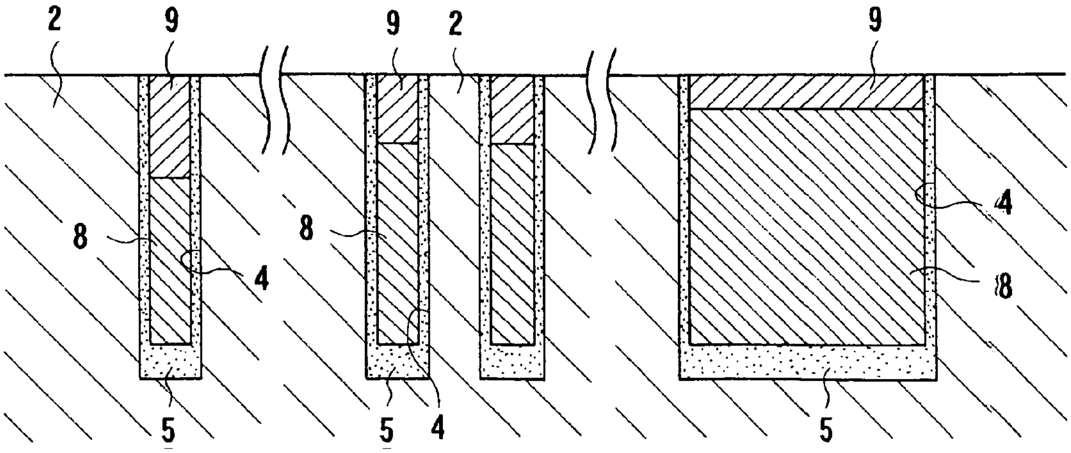
FIGS. 5A through 5C are cross-sectional diagrams showing the state of the same substrate shown in FIGS. 4A through 4C but after selectively forming a protective film on the pre-treated substrate.

Preferred embodiments of the present invention will now be described with reference to the drawings. A description will first be given of an embodiment in which exposed surfaces of interconnects 8 as base metal are selectively covered with a protective film (cap material) 9 of a CoWP alloy to protect the interconnects (base metal) 8 with the protective film (alloy film) 9, as show in FIG. 1D. The present invention is, of course, applicable to plating for forming a metal film (plated film) of a Co alloy, a Ni alloy, etc., for example on the surface of copper or silver, thus covering the surface of copper or silver with the metal film, or to pad plating for bumps.

FIG. 9 shows a layout plan of a plating apparatus for carrying out a plating method (forming protective film by electroless prating) according to an embodiment of the present invention. As shown in FIG. 9, this plating apparatus has a loading/unloading unit 12 for placing and receiving a substrate cassette 11 housing substrates W (see FIG. 1C), such as semiconductor devices (semiconductor wafers), each having interconnects (base metal) 8 made of copper or the like formed in via holes 3 and trenches 4 formed in a surface thereof. A pre-treatment unit 18 for performing a pretreatment of a substrate W, a catalytic treatment unit 20 for performing a catalytic treatment for applying a catalyst to surfaces of interconnects 8 of pre-treated substrate, and a post-catalyzation treatment unit 22 for performing a post-catalyzation treatment of the substrate W after the catalytic treatment are disposed in series along one of long sides of a rectangular housing 16 having an exhaust system.

An electroless plating unit 26 for performing an electroless plating process on the surface (surface to be processed) of the substrate W, a post-plating treatment unit 28 for performing a post-plating treatment of the substrate W to improve the selectivity of a protective film (alloy film) 9 (see FIG. 1D) formed on the surfaces of the interconnects 8 by the electroless plating process, and a drying unit 30 for drying the substrate W after the post-treatment are disposed in series along the other of the long sides of the housing 16. Further, a transfer robot 34 movable along a rail 32 in parallel to the long sides of the housing 16 and for delivering a substrate between these units and the substrate cassette 11 placed on the loading/unloading unit 12 is disposed so as to be interposed between these units linearly arranged.

Next, a series of electroless plating processing by this plating apparatus will be described with reference to FIG. 10.

First, a substrate W having interconnects 8 formed in a surface thereof is taken by the transfer robot 34 out of the substrate cassette 11, which houses substrates W in a state such that front surfaces of the substrates W face upward (in a face-up manner), placed on the loading/unloading unit 12, and is transferred to the pre-treatment unit 18. In the pre-treatment unit 18, the substrate W is held face down, and a surface-active treatment is performed as a pre-plating treatment on a surface of the substrate W. Specifically, a pre-treatment liquid e.g. at a temperature of 25° C., containing 0.1 M of $H_2SO_4$ as a surface activating agent for the interconnects 8 and 0.01 g/L of benzotriazole as an excessive etching inhibitor for the interconnects 8, is jetted toward the surface of the substrate W e.g. for one minute, to etch away e.g. an oxide film on interconnects 8, thereby activating surfaces of interconnects 8. Thereafter, a pre-treatment liquid remaining on the surface of the substrate W is rinsed (cleaned) with a rinsing liquid, such as pure water.

A solution containing a surface activating agent for the interconnects (base metal) 8 and an excessive etching inhibitor for the interconnects 8 can be used as a pre-treatment liquid. Usable surface active agents for the interconnects 8 include, besides $H_2SO_4$ used in this embodiment, inorganic acids such as HCl, $HNO_3$ and HF, organic acids such as a carboxylic acid and an alkanesulfonic acid, inorganic alkalis such as ammonia water, and organic alkalis such as choline and TMAH. A compound having an atom chemically adsorptive to the interconnects 8 of e.g. copper, such as an N atom-containing compound, may be used as the excessive etching inhibitor for the interconnects 8. Chemical adsorption refers to adsorption that occurs at the interface between two phases by the action of a chemical bonding force between molecules (atoms) of the first phase (adsorbate) and the surface of the second phase (adsorbent). A specific example of atoms chemically adsorbed to the interconnects 8 is an N atom. Examples of an N atom-containing cyclic organic compounds include, besides benzotriazole used in this embodiment, pyrazole, imidazole and benzimidazole. Benzotriazole, which is a common inhibitor for copper, is an N atom-containing chemically adsorptive material, having the above-described chemical formula, which is adsorbed onto surface activated points of copper. Benzotriazole is generally employed especially as an antioxidant. The N atom-containing compound as an excessive etching inhibitor for the interconnects 8 may also be an organic compound having an amine structure. Examples of the organic compound having an amine structure include methylamine, ethylamine, N, N-dimethylaniline and diphenylamine.

Next, the substrate W after the pretreatment is transferred by the transfer robot 34 to the catalytic treatment unit 20, where the substrate W, while it is kept held face down, is subjected to catalytic treatment in order to apply a catalyst, such as Pd, to the surface of the substrate. In particular, a catalytic treatment liquid e.g. at a temperature of 25° C., containing 0.01 M of $PdSO_4$ as a catalyst metal supply source, 0.1 M of $H_2SO_4$ as a supporting electrolyte and, as in the above pre-treatment liquid, 0.01 g/L of benzotriazole as an excessive etching inhibitor for the interconnects (base metal) 8, is jetted toward the surface of the substrate W e.g. for one minute, thereby applying Pd as a catalyst to the surfaces of the interconnects 8. Pd nuclei as catalytic nuclei (seeds) are thus formed on the surfaces of the interconnects 8, and the exposed surfaces of the interconnects 8 are activated. Thereafter, the catalytic treatment liquid (chemical) remaining on the surface of the substrate W is rinsed (cleaned) with a rinsing liquid, such as pure water.

A solution containing catalyst metal ions, a supporting electrolyte and an excessive etching inhibitor for the interconnects 8 can be used as a catalytic treatment liquid. The supporting electrolyte may be used according to necessity. Usable catalyst metal ions include, besides Pd ions used in this embodiment, Sn ions, Ag ions, Pt ions, Au ions, Cu ions, Co ions and Ni ions. The use of Pd ions is particularly preferred from the viewpoints of the reaction rate, ease of control, or the like. Usable supporting electrolytes include, besides $H_2SO_4$ used in this embodiment, inorganic acids such as HCl, $HNO_3$ and HF, organic acids such as a carboxylic acid and an alkanesulfonic acid, inorganic alkalis such as ammonia water, and organic alkalis such as choline and TMAH.

The substrate W after the catalytic treatment and rinsing treatment is transferred by the transfer robot 34 to the post-catalyzation treatment unit 22, where the substrate W, while it is kept held face down, is subjected to post-catalyzation treatment. In particular, a post-treatment liquid containing a component for removing an excessive etching inhibitor for the base metal, for example, an alkali solution containing an organic alkali such as TMAH or choline, or an inorganic alkali such as $NH_3OH$, NaOH or KOH, is jetted toward the surface of the substrate W, thereby removing an excess of the excessive etching inhibitor remaining on the surface of the substrate W. Thereafter, the post-treatment liquid (chemical) remaining on the surface of the substrate W is rinsed (cleaned) with a rinsing liquid, such as pure water. The excessive etching inhibitor for the base metal is thus prevented from remaining on the surface of the substrate W after the catalytic treatment and adversely affecting the later plating process or the like.

Next, the substrate W after the post-catalyzation treatment is transferred by the transfer robot to the electroless plating unit 26, where electroless plating of the surface of the substrate is carried out. In particular, the substrate W is immersed in a CoWP-plating solution e.g. at a temperature of 85° C. e.g. for about 120 seconds to carry out selective electroless plating (electroless Co—W—P cap plating) of the surfaces of interconnects 8 carrying Pd as a catalyst, thereby selectively forming a protective film (cap material) 9. The following is an example of the composition of the plating solution.

Composition of Plating Solution $CoSO_4 \cdot 7H_2O$: 14 g/L $Na_3C_6H_5O_7 \cdot 2H_2O$: 80 g/L $(NH_4)_2SO_4$: 60 g/L $NaH_2PO_2$: 20 g/L $Na_2WO_4.2H_2O$: 40 g/L pH: 10 (adjusted with NaOH solution)

After lifting the substrate W from the plating solution, a neutral stop liquid having a pH of 6 to 7.5 is brought into contact with the surface of the substrate W to thereby stop the electroless plating. By thus promptly stopping the plating reaction immediately after lifting the substrate W from the plating solution, the plating film can be prevented from becoming uneven. A preferred time of this treatment is, for example, 1 to 5 seconds. Pure water, water containing dissolved hydrogen or electrolytic cathode water may be used as the stop liquid.

Thereafter, the plating solution remaining on the surface of the substrate is rinsed (cleaned) with a rinsing liquid, such as pure water. The protective film 9 of a CoWP alloy is thus formed selectively on the surfaces of the interconnects 8 to protect the interconnects 8.

Next, the substrate W after the electroless plating is transferred by the transfer robot 34 to the post-plating treatment unit 28, where the substrate W is subjected to post-plating treatment in order to enhance the selectivity of the protective film (plated film) 9 formed on the surface of the substrate W and thereby increase the yield. In particular, while applying a physical force to the surface of the substrate W, for example, by roll scrub cleaning or pencil cleaning, a treatment liquid (chemical) is supplied onto the surface of the substrate W to thereby completely remove plating residues, such as fine metal particles, from the insulating film 2, thus enhancing the selectivity of plating.

The substrate W after the post-plating treatment is transferred by the transfer robot 34 to the drying unit 30, where the substrate W is rinsed, according to necessity, and then rotated at a high speed to spin-dry the substrate W.

The substrate W after the spin-drying is returned by the transfer robot 34 to the substrate cassette 11 mounted in the loading/unloading unit 12.

This embodiment illustrates the case of using copper (Cu) as an interconnect material and forming the protecting film 9 of CoWP alloy selectively on the surfaces of the interconnects 8 composed of copper. It is also possible to use a Cu alloy, Ag or an Ag alloy as an interconnect material. Further, it is also possible to use as the protective film 9 a film of CoWB, CoP, CoB or other Co alloy, NiWP, NiWB, NiP, NiB or other Ni alloy.

Transfer of the substrate between each unit and the transfer robot is preferably carried out after drying the substrate.

Next, a description will now be given of the respective state of the substrate after the pretreatment using the pre-treatment liquid, after the catalytic treatment using the catalytic treatment liquid, and after the electroless plating, based on schematic drawings shown in FIGS. 11A through 11D. FIGS. 11A through 11D illustrate, as with FIGS. 2A through 2D illustrating the conventional method, the case of forming a copper film 502 constituting interconnects 8 (see FIG. 1C) on the surface of a barrier layer 500 of TaN, and forming a protective film 504 of a CoWP alloy by electroless plating on the surface of the copper film 502.

The copper film 502 is a polycrystalline film having a plurality of crystalline orientations and comprising a large number of copper crystal grains 502*a* which are considered to be linked planewise to each other at crystal grain boundaries 502*b*, as shown in FIG. 11A. The surface of the copper film 502 is contacted with (immersed in) e.g. a pre-treatment liquid containing, besides $H_2SO_4$ as a surface activating agent, benzotriazole as an excessive etching inhibitor for the copper film 502, which is a compound having an atom (N atom) chemically adsorptive to the copper film 502, thereby etching away copper oxide (CuO) present in the surface of the copper film 502 with $H_2SO_4$ and activating the surface. Upon the etching, as shown in FIG. 11B, the copper film 502 is etched and removed excessively at the upper portions of the crystal grain boundaries 502*b* between adjacent copper crystal grains 502*a* selectively, resulting in the formation of recesses 506 while, at the same time, benzotriazole, the compound having an atom (N atom) chemically adsorptive to the copper film 502, is chemically adsorbed as a filler 512 selectively onto the interior surfaces of the recesses 506, whereby the recesses 506 are filled with the filler (benzotriazole) 512.

The surface of the copper film 502 is then contacted with (immersed in) e.g. a catalytic treatment liquid containing, besides $PdSO_4$ as a metal ion supply source and $H_2SO_4$ as a supporting electrolyte, benzotriazole, the same excessive etching inhibitor for the copper film 502 as used in the pre-treatment liquid, thereby forming a Pd catalyst layer 508, comprising Pd as a catalyst, on the surface of the copper film 502. Upon the catalytic treatment, as shown in FIG. 11C, benzotriazole is chemically adsorbed onto the copper crystal grains 502*a* selectively along the weak crystal grain boundaries 502*b*, thereby preventing the formation of voids along the crystal grain boundaries 502*b*. At this time, application of Pd (replacement of Cu with Pd) to the surfaces of the copper crystal grains 502*a* simultaneously proceeds as shown by the following formula (4), whereby the minimum necessary amount of Pd is carried on the surface of the copper film 502.

$$Cu \rightarrow Cu^{2+} + 2e^-,\ Pd^{2+} + 2e^- \rightarrow Pd \quad (4)$$

By subsequently forming a protective film 504 of a CoWP alloy on the surface of the copper film 502 by electroless plating, a protective film 504 of a CoWP alloy can be formed on the surface of the copper film 502 while preventing the formation of voids in the copper film 502, as shown in FIG. 11D. The reliability of the interconnects can thus be enhanced and, in addition, an increase in the resistance of the interconnects can be prevented.

Next, there will be described below the details of various units provided in the plating apparatus shown in FIG. 9.

The pre-treatment unit 18, the catalytic treatment unit 20 and the post-catalyzation treatment unit 22 use different treatment liquids (chemicals) but have the same structure which employs a two-liquid separation system to prevent the different liquids from being mixed with each other. While a peripheral portion of a lower surface of the substrate W, which is a surface to be processed (front face), transferred in a face-down manner is sealed, the substrate W is fixed by pressing a rear face of the substrate.

As shown in FIGS. 12 through 15, each of the treatment units 18, 20 and 22 includes a fixed frame 52 mounted on an upper portion of a frame 50, and a movable frame 54 which is vertically movable relative to the fixed frame 52. A treatment head 60, which has a bottomed cylindrical housing portion 56 opened downward and a substrate holder 58, is suspended from and supported by the movable frame 54. Specifically, a servomotor 62 for rotating the head is mounted on the movable frame 54, and the housing portion 56 of the treatment head 60 is coupled to a lower end of an output shaft (hollow shaft) 64, which extends downward, of the servomotor 62.

Figure 15:
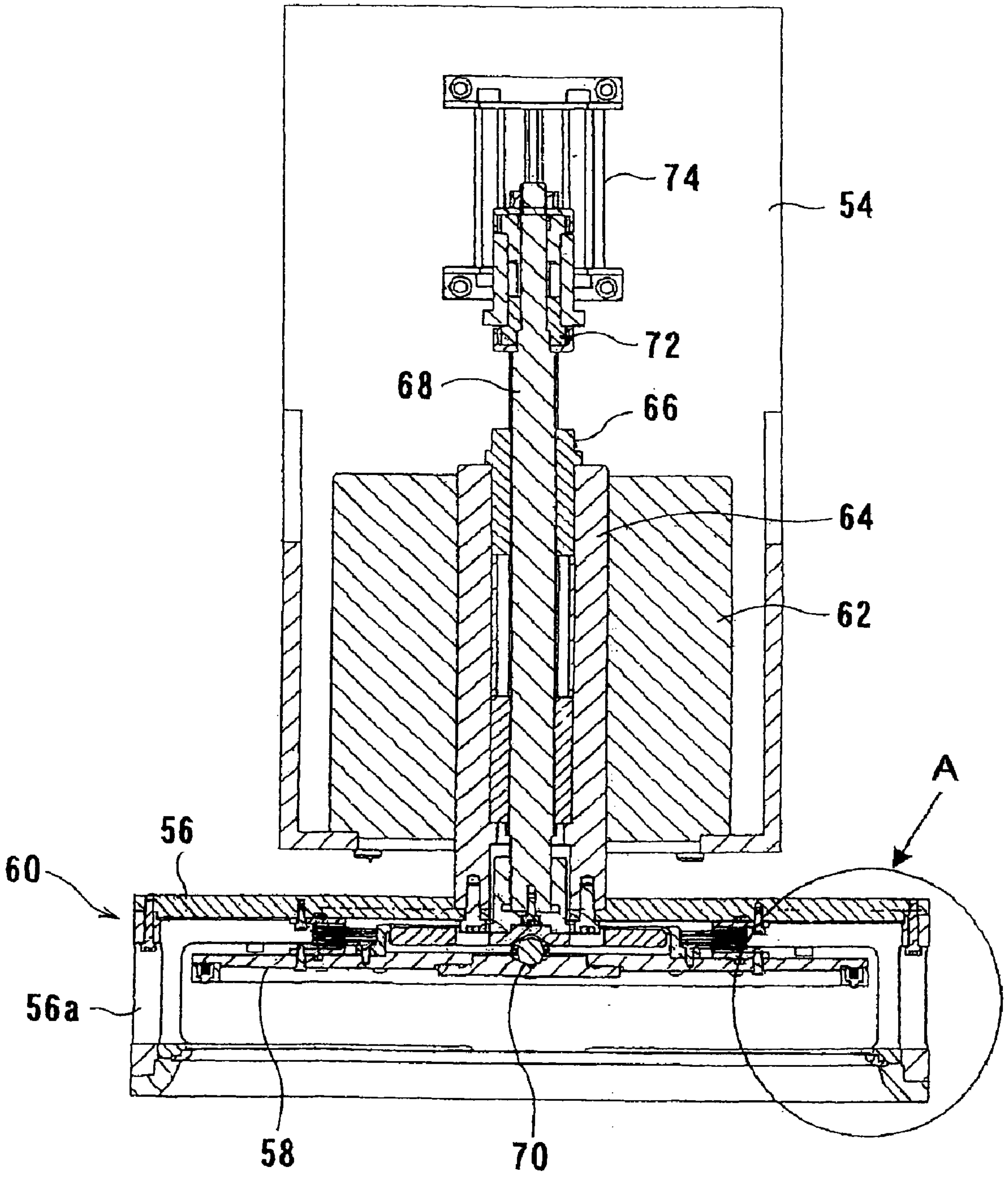
FIG. 15 is a cross-sectional view showing a treatment head of the pre-treatment unit or the catalytic treatment unit at the time of substrate delivery.

As shown in FIG. 15, a vertical shaft 68, which rotates together with the output shaft 64 via a spline 66, is inserted in the output shaft 64, and the substrate holder 58 of the treatment head 60 is coupled to a lower end of the vertical shaft 68 via a ball joint 70. The substrate holder 58 is positioned within the housing portion 56. An upper end of the vertical shaft 68 is coupled via a bearing 72 and a bracket to a cylinder 74 for vertically moving a fixed ring, which is secured to the movable frame 54. Thus, by actuation of the cylinder 74 for vertically movement, the vertical shaft 68 is vertically moved independently of the output shaft 64.

Linear guides 76, which extend vertically and serve to guide vertical movement of the movable frame 54, are mounted to the fixed frame 52, so that the movable frame 54 is moved vertically with a guide of the linear guides 76 by actuation of a cylinder (not shown) for vertically moving the head.

Substrate insertion windows 56*a* for inserting the substrate W into the housing portion 56 are formed in a circumferential wall of the housing portion 56 of the treatment head 60. Further, as shown in FIGS. 16 and 17, a seal ring 84*a* is disposed in a lower portion of the housing portion 56 of the treatment head 60 with an outer peripheral portion of the seal ring 84*a* being sandwiched between a main frame 80 made of, for example, PEEK and a guide frame 82. The seal ring 84*a* is brought into abutment against a peripheral portion of a lower surface of the substrate W to seal the peripheral portion.

Meanwhile, a substrate fixing ring 86 is fixed to a peripheral portion of a lower surface of the substrate holder 58. Columnar pushers 90 each protrudes downward from a lower surface of the substrate fixing ring 86 by an elastic force of a spring 88 disposed within the substrate fixing ring 86 of the substrate holder 58. Further, a flexible cylindrical bellows plate 92 made of, for example, Teflon (registered trademark) is disposed between an upper surface of the substrate holder 58 and an upper wall of the housing portion 56 to hermetically seal therein.

When the substrate holder 58 is in a lifted position, a substrate W is inserted through the substrate insertion window 56*a* into the housing portion 56. The substrate W is then guided by a tapered surface 82*a* provided in an inner circumferential surface of the guide frame 82, and positioned and placed at a predetermined position on an upper surface of the seal ring 84*a*. In this state, the substrate holder 58 is lowered so as to bring the pushers 90 of the substrate fixing ring 86 into contact with an upper surface of the substrate W. The substrate holder 58 is further lowered so as to press the substrate W downward by elastic forces of the springs 88. Thus, the seal ring 84*a* is brought into contact with a peripheral portion of the front face (lower surface) of the substrate W under pressure to seal the peripheral portion while clamping and holding the substrate W between the housing portion 56 and the substrate holder 58.

When the servomotor 62 for rotating the head is driven in a state such that the substrate W is thus held by the substrate holder 58, the output shaft 64 and the vertical shaft 68 inserted in the output shaft 64 rotate together via the spline 66, so that the substrate holder 58 rotates together with the housing portion 56.

At a position below the treatment head 60, there is provided a treatment tank 100 having an outer tank 100*a* and an inner tank 100*b*, which has a slightly larger inside diameter than the outside diameter of the treatment head 60 and are opened upward. A pair of leg portions 104, which is mounted to a lid 102, is rotatably supported on an outer circumferential portion of the treatment tank 100. Further, a crank 106 is integrally coupled to each leg portion 106, and a free end of the crank 106 is rotatably coupled to a rod 110 of a cylinder 108 for moving the lid. Thus, by actuation of the cylinder 108 for moving the lid, the lid 102 is moved between a treatment position at which the lid 102 covers a top opening portion of the treatment tank 100 and a retracting position beside the treatment tank 100. On the front face (upper surface) of the lid 102, there, is provided a nozzle plate 112 having a large number of ejection nozzles 112 for outwardly (upwardly) ejecting, for example, pure water.

Figure 18:
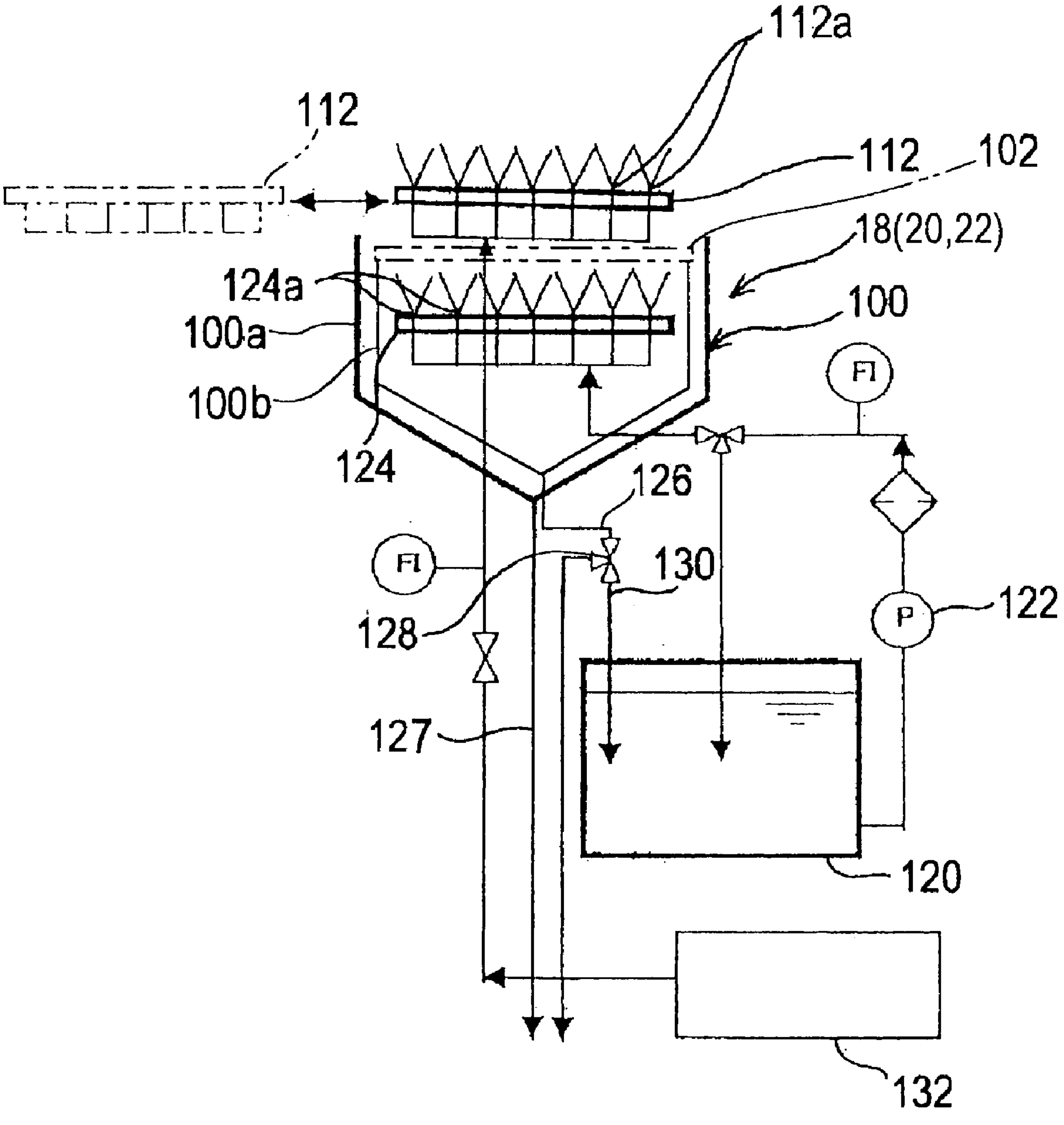
FIG. 18 is a schematic diagram of the pre-treatment unit or the catalytic treatment unit.

Further, as shown in FIG. 18, a nozzle plate 124 having a plurality of ejection nozzles 124*a* for upwardly ejecting a chemical liquid supplied from a chemical liquid tank 120 by actuation of a chemical liquid pump 122 is provided in the inner tank 100*b* of the treatment tank 100 in a manner such that the ejection nozzles 124*a* are equally distributed over the entire surface of a horizontal cross-section of the inner tank 100*b*. A drainpipe 126 for draining a chemical liquid (waste liquid) to the outside is connected to the bottom of the inner tank 100*b*. A three-way valve 128 is provided in the drainpipe 126, and the chemical liquid (waste liquid) is returned to the chemical liquid tank 120 through a return pipe 130 connected to one of outlet ports of the three-way valve 128 so as to reuse the chemical liquid, as needed. Further, in this embodiment, the nozzle plate 112 provided on the front face (upper surface) of the lid 102 is connected to a rinsing liquid supply source 132 for supplying a rinsing liquid, such as pure water. Furthermore, a drainpipe 127 is connected to a bottom surface of the outer tank 100*a*.

By lowering the treatment head 60 holding the substrate so as to cover the top opening portion of the treatment tank 100 with the treatment head 60 and then ejecting a chemical liquid from the ejection nozzles 124*a* of the nozzle plate 124 disposed in the inner tank 100*b* of the treatment tank 100 toward the substrate W, the chemical liquid can be ejected uniformly onto the entire lower surface (surface to be processed) of the substrate W and discharged through the drainpipe 126 to the outside while preventing the chemical liquid from being scattered to the outside. Further, by lifting up the treatment head 60, closing the top opening portion of the treatment tank 100 with the lid 102, and then ejecting a rinsing liquid from the ejection nozzles 112*a* of the nozzle plate 112 disposed on the upper surface of the lid 102 toward the substrate W held in the treatment head 60, a rinsing process (cleaning process) for a chemical liquid remaining on the surface of the substrate is performed. Since the rinsing liquid passes through a clearance between the outer tank 100*a* and the inner tank 100*b* and is discharged through the drainpipe 127, the rinsing liquid is prevented from flowing into the inner tank 100*b* and from being mixed with the chemical liquid.

Figure 13:
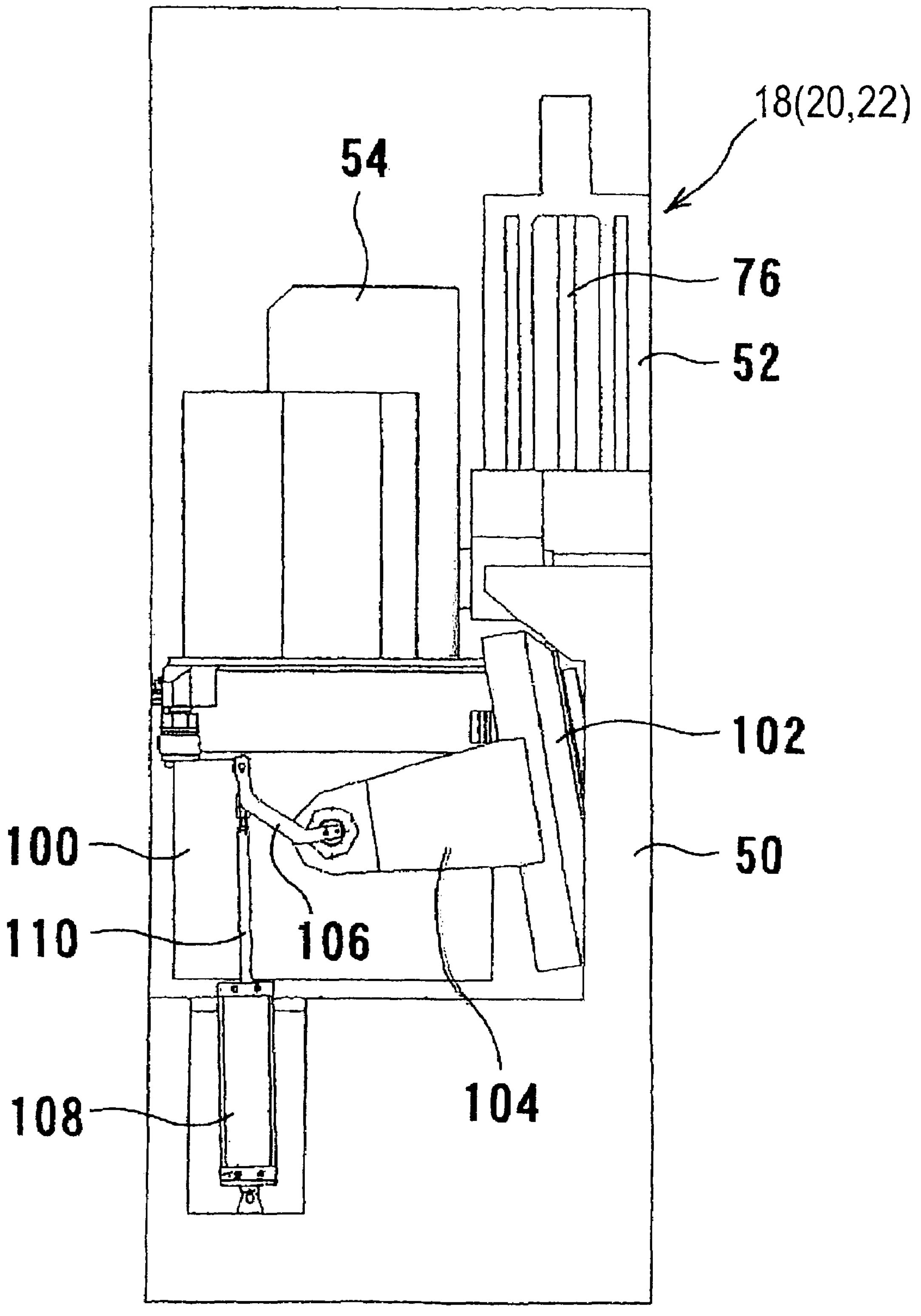
FIG. 13 is a front view of the pre-treatment unit or the catalytic treatment unit at the time of a chemical liquid treatment.

According to the treatment units 18, 20 and 20, the substrate W is inserted into and held in the treatment head 60 when the treatment head 60 is in the lifted position, as shown in FIG. 12. Thereafter, as shown in FIG. 13, the treatment head 60 is lowered to a position at which the treatment head 60 covers the top opening portion of the treatment tank 100. While rotating the treatment head 60 and thereby rotating the substrate W held in the treatment head 60, a chemical liquid is ejected from the ejection nozzles 124*a* of the nozzle plate 124 disposed in the treatment tank 100 toward the substrate W to thereby eject the chemical liquid uniformly onto the entire surface of the substrate W. The treatment head 60 is lifted up and stopped at a predetermined position. As shown in FIG. 14, the lid 102 in the retracting position is moved to a position at which the lid 102 covers the top opening portion of the treatment tank 100. Then, a rinsing liquid is ejected from the ejection nozzles 112*a* of the nozzle plate 112 disposed on the upper surface of the lid 102 toward the rotating substrate W held in the treatment head 60. Thus, a process of the substrate W with a chemical liquid and a rinsing process of the substrate W with a rinsing liquid can be performed without mixing these two liquids.

FIGS. 19 through 23 show the electroless plating unit 26. This electroless plating unit 26 has a plating tank 200 (see FIG. 23) and a substrate head 204 disposed above the plating tank 200 for detachably holding a substrate W.

As shown in detail in FIG. 19, the substrate head 204 has a housing portion 230 and a head portion 232. The head portion 232 is mainly composed of a suction head 234 and a substrate receiver 236 surrounding the suction head 234. A motor 238 for rotating the substrate and cylinders 240 for driving the substrate receiver are housed in the housing portion 230. An upper end of an output shaft (hollow shaft) 242 of the motor 238 for rotating the substrate is coupled to a rotary joint 244, and a lower end of the output shaft is coupled to the suction head 234 of the head portion 232. Rods of the cylinders 240 for driving the substrate receiver are coupled to the substrate receiver 236 of the head portion 232. Stoppers 246 are provided in the housing portion 230 for mechanically limiting upward movement of the substrate receiver 236.

A splined structure is provided between the suction head 234 and the substrate receiver 236. The substrate receiver 236 is vertically moved relative to the suction head 234 by actuation of the cylinders 240 for driving the substrate receiver. When the motor 238 for rotating the substrate is driven to rotate the output shaft 242, the suction head 234 and the substrate receiver 236 are rotated in unison with each other according to the rotation of the output shaft 242.

As shown in detail in FIGS. 20 through 22, a suction ring 250 for attracting and holding a substrate W against its lower surface to be sealed is mounted on a lower circumferential edge of the suction head 234 by a presser ring 251. A recess 250*a* continuously defined in a lower surface of the suction ring 250 in a circumferential direction communicates with a vacuum line 252 extending through the suction head 234 through a communication hole 250*b* defined in the suction ring 250. By evacuating the recess 250*a*, the substrate W is attracted and held. Thus, the substrate W is attracted and held under vacuum along a (radially) narrow circumferential area. Accordingly, it is possible to minimize any adverse effects (flexing or the like) caused by the vacuum on the substrate W. Further, when the suction ring 250 is immersed in the plating solution (treatment liquid), all portions of the substrate W including not only the front face (lower surface) of the substrate W, but also its circumferential edge can be immersed in the plating solution. The substrate W is released by supplying $N_2$ into the vacuum line 252.

Meanwhile, the substrate receiver 236 is in the form of a bottomed cylinder opened downward. Substrate insertion windows 236*a* for inserting the substrate W into the substrate receiver 236 are defined in a circumferential wall of the substrate receiver 236. A disk-like ledge 254 projecting inward is provided at a lower end of the substrate receiver 236. A protrusion 256 having an inner tapered surface 256*a* for guiding the substrate W is provided on an upper portion of the ledge 254.

As shown in FIG. 20, when the substrate receiver 236 is in a lowered position, the substrate W is inserted through the substrate insertion window 236*a* into the substrate receiver 236. The substrate W is then guided by the tapered surface 256*a* of the protrusion 256 and positioned and placed at a predetermined position on an upper surface of the ledge 254 of the substrate receiver 236. In this state, as shown in FIG. 21, the substrate receiver 236 is lifted up so as to bring the upper surface of the substrate W placed on the ledge 254 of the substrate receiver 236 into abutment against the suction ring 250 of the suction head 234. Then, the recess 250*a* in the vacuum ring 250 is evacuated through the vacuum line 252 to attract and hold the substrate W while sealing the upper peripheral edge surface of the substrate W against the lower surface of the suction ring 250. For performing a plating process, as shown in FIG. 22, the substrate receiver 236 is lowered several millimeters to space the substrate W from the ledge 254 so that the substrate W is attracted and held only by the suction ring 250. Thus, it is possible to prevent the front face (lower surface) of the peripheral edge portion of the substrate W from not being plated because of the presence of the ledge 254.

FIG. 23 shows the details of the plating tank 200. The plating tank 200 is connected at the bottom to a plating solution supply pipe 308 (see FIG. 25) and is provided in the peripheral wall with a plating solution recovery gutter 260. In the plating tank 200, there are disposed two current plates 262, 264 for stabilizing the flow of a plating solution flowing upward. A thermometer 266 for measuring the temperature of the plating solution to be introduced into the plating tank 200 is disposed at the bottom of the plating tank 200. Further, on the outer surface of the peripheral wall of the plating tank 200 and at a position slightly higher than the liquid level of the plating solution held in the plating tank 200, there is provided an ejection nozzle 268 for ejecting a stop solution which is a neutral liquid having a pH of 6 to 7.5, for example, pure water, slightly upward with respect to a diametrical direction in the plating tank 200. After the plating, the substrate W held in the head portion 232 is lifted up and stopped at a position slightly above the liquid level of the plating solution. In this state, pure water (stop solution) is ejected from the ejection nozzle 268 toward the substrate W to cool the substrate W immediately, thereby preventing progress of plating by the plating solution remaining on the substrate W.

Further, at a top opening portion of the plating tank 200, there is provided a plating tank cover 270 capable of opening and closing which closes the top opening portion of the plating tank 200 so as to prevent unnecessary evaporation of the plating solution from the plating tank 200 when the plating process is not performed, such as at the time of idling.

As shown in FIG. 25, the plating tank 200 is connected at the bottom to a plating solution supply pipe 308 extending from a plating solution reservoir tank 302, and having a plating solution supply pump 304 and a three-way valve 306. Thus, during a plating process, a plating solution is supplied from the bottom of the plating tank 200 into the plating tank 200, and an overflowing plating solution is recovered to the plating solution reservoir tank 302 by the plating solution recovery gutter 260. Thus, the plating solution can be circulated. A plating solution return pipe 312 for returning the plating solution to the plating solution reservoir tank 302 is connected to one of ports of the three-way valve 306. Accordingly, the plating solution can be circulated even at the time of a standby for plating. Thus, a plating solution circulating system is constructed. As described above, the plating solution in the plating solution reservoir tank 302 is continuously circulated through the plating solution circulating system to thus reduce a rate of lowering the concentration of the plating solution and to increase the number of the substrates W which can be processed, as compared to a case where a plating solution is simply stored.

The thermometer 266 provided in the vicinity of the bottom of the plating tank 200 measures the temperature of the plating solution to be introduced into the plating tank 200 and controls a heater 316 and a flow meter 318 described below based on the measurement results.

Specifically, in this embodiment, there are provided a heating device 322 for heating the plating solution indirectly by a heat exchanger 320 provided in the plating solution in the plating solution reservoir tank 302 and employing, as a heating medium, water that has been increased in temperature by a separate heater 316 and passed through the flow meter 318, and a stirring pump 324 for circulating the plating solution in the plating solution reservoir tank 302 to stir the plating solution. This is because the unit should be arranged so that the unit can cope with a case where the plating solution is used at a high temperature (about 80° C.). This method can prevent an extremely delicate plating solution from being mixed with foreign matter or the like, unlike an in-line heating method.

FIG. 24 shows the details of a cleaning tank 202 provided beside the plating tank 200. At the bottom of the cleaning tank 202, there is provided a nozzle plate 282 onto which a plurality of ejection nozzles 280 for ejecting a rinsing liquid such as pure water upward are attached. The nozzle plate 282 is coupled to an upper end of a nozzle vertical shaft 284. The nozzle vertical shaft 284 can be moved vertically by changing positions of engagement between a nozzle position adjustment screw 287 and a nut 288 engaging the screw 287 so as to optimize a distance between the ejection nozzles 280 and the substrate W disposed above the ejection nozzles 280.

Further, on the outer surface of the peripheral wall of the cleaning tank 202 and at a position higher than the ejection nozzles 280, there is provided a head cleaning nozzle 286 for ejecting a cleaning liquid such as pure water slightly downward with respect to a diametric direction in the cleaning tank 202 to blow the cleaning liquid to at least a portion of the head portion 232 of the substrate head 204 which is brought into contact with the plating solution.

In the cleaning tank 202, the substrate W held in the head portion 232 of the substrate head 204 is located at a predetermined position in the cleaning tank 202. A cleaning liquid (rinsing liquid) such as pure water is ejected from the ejection nozzles 280 to clean (rinse) the substrate W. At that time, a cleaning liquid such as pure water is ejected from the head cleaning nozzle 286 to clean, with the cleaning liquid, at least a portion of the head portion 232 of the substrate head 204 which is brought into contact with the plating solution, thereby preventing a deposit from accumulating on a portion which is immersed in the plating solution.

According to this electroless plating unit 26, when the substrate head 204 is in a lifted position, the substrate W is attracted to and held in the head portion 232 of the substrate head 204 as described above, while the plating solution in the plating tank 200 is circulated.

When a plating process is performed, the plating tank cover 270 of the plating tank 200 is opened, and the substrate head 204 is lowered while being rotated. Thus, the substrate W held in the head portion 232 is immersed in the plating solution in the plating tank 200.

After immersing the substrate W in the plating solution for a predetermined period of time, the substrate head 204 is raised to lift the substrate W from the plating solution in the plating tank 200 and, as needed, pure water (stop solution) is ejected from the ejection nozzles 268 toward the substrate W to immediately cool the substrate W, as described above. The substrate head 204 is further raised to lift the substrate W to a position above the plating tank 200, and the rotation of the substrate head 204 is stopped.

Next, while the substrate W is attracted to and held in the head portion 232 of the substrate head 204, the substrate head 204 is moved to a position right above the cleaning tank 202. While the substrate head 204 is rotated, the substrate head 204 is lowered to a predetermined position in the cleaning tank 202. A cleaning liquid (rinsing liquid) such as pure water is ejected from the ejection nozzles 280 to clean (rinse) the substrate W. At that time, a cleaning liquid such as pure water is ejected from the head cleaning nozzle 286 to clean at least a portion the head portion 232 of the substrate head 204 which is brought into contact with the plating solution.

After completion of cleaning of the substrate W, the rotation of the substrate head 204 is stopped, and the substrate head 204 is raised to lift the substrate W to a position above the cleaning tank 202. Further, the substrate head 204 is moved to a transfer position between the transfer robot 34 and the substrate head 204. Then, the substrate W is delivered to the transfer robot 34 and is transferred to a subsequent process by the transfer robot 34.

Figure 26:
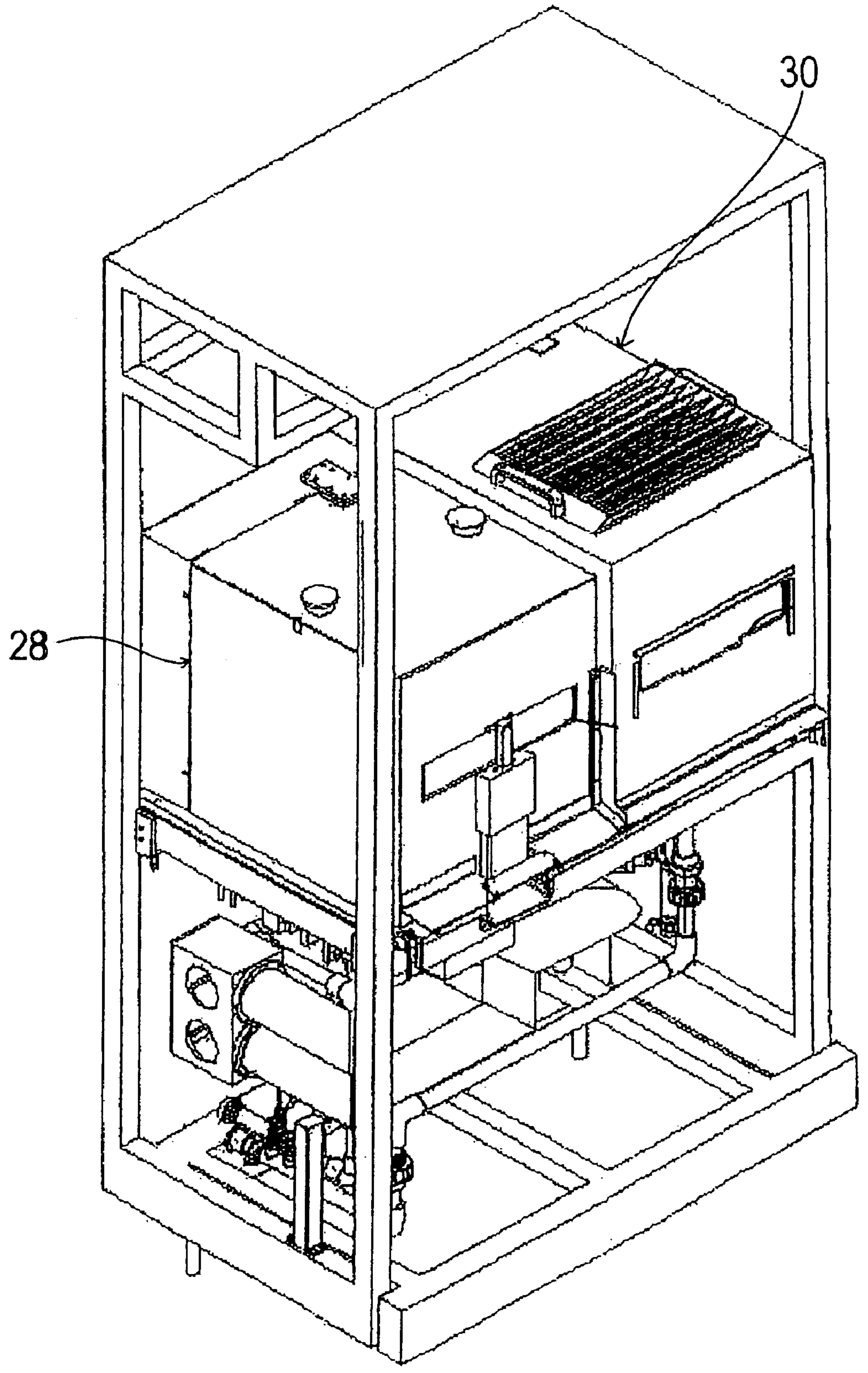
FIG. 26 is a perspective view showing a post-treatment unit and a drying unit.

FIG. 26 shows the post-plating treatment unit 28 and the drying unit 30 of FIG. 9. A roll brush is provided in the post-plating treatment unit 28, and a spin-drying device is provided in the drying unit 30.

FIG. 27 shows the post-plating treatment unit 28. The post-plating treatment unit 28 is a unit for forcibly removing particles and unnecessary matters on the substrate W with a roll-shaped brush, and includes a plurality of rollers 410 for holding the substrate W by nipping its peripheral portion, a chemical nozzle 412 for supplying a treatment liquid (two lines) to the front surface of the substrate W held by the rollers 410, and a pure water nozzle (not shown) for supplying pure water (one line) to the back surface of the substrate W.

In operation, the substrate W is held by the rollers 410 and a roller drive motor is driven to rotate the rollers 410 and thereby rotate the substrate W, while predetermined treatment liquids are supplied from the chemical nozzle 412 and the pure water nozzle to the front and back surfaces of the substrate W and the substrate W is nipped between not-shown upper and lower roll sponges (roll-shaped brushes) at an appropriate pressure, thereby cleaning the substrate W. It is also possible to rotate the roll sponges independently so as to increase the cleaning effect.

The post-plating treatment unit 28 also includes a sponge (PFR) 419 that rotates while contacting the edge (peripheral portion) of the substrate W, thereby scrub-cleaning the edge of the substrate W.

FIG. 28 shows the drying unit 30. The drying unit 30 is a unit for first carrying out chemical cleaning and pure water cleaning of the substrate W, and then fully drying the cleaned substrate W by spindle rotation, and includes a substrate stage 422 provided with a clamping mechanism 420 for clamping an edge portion of the substrate W, and a substrate attachment/detachment lifting plate 424 for opening/closing the clamping mechanism 420. The substrate stage 422 is coupled to the upper end of a spindle 428 that rotates at a high speed by the actuation of a spindle rotating motor 426.

Further, positioned on the side of the upper surface of the substrate W clamped by the clamping mechanism 420, there are provided a mega-jet nozzle 430 for supplying pure water to which ultrasonic waves from a ultrasonic oscillator have been transmitted during its passage through a special nozzle to increase the cleaning effect, and a rotatable pencil-type cleaning sponge 432, both mounted to the free end of a pivot arm 434. In operation, the substrate W is clamped by the clamping mechanism 420 and rotated, and the pivot arm 434 is pivoted while pure water is supplied from the mega-jet nozzle 430 to the cleaning sponge 432 and the cleaning sponge 432 is rubbed against the front surface of the substrate W, thereby cleaning the front surface of the substrate W. A cleaning nozzle (not shown) for supplying pure water is provided also on the side of the back surface of the substrate W, so that the back surface of the substrate W can also be cleaned with pure water jetted from the cleaning nozzle.

The thus-cleaned substrate W is spin-dried by rotating the spindle 428 at a high speed.

A cleaning cup 436, surrounding the substrate W clamped by the clamping mechanism 420, is provided for preventing scattering of a cleaning liquid. The cleaning cup 436 is designed to move up and down by the actuation of a cleaning cup lifting cylinder 438.

It is also possible to provide the drying unit 30 with a cavi-jet function utilizing cavitation.

EXAMPLE 1

30 nm-thick TaN was deposited on a surface of a silicon substrate, and copper plating of the surface of the substrate was then carried out to thereby deposit a 3000 nm-thick copper film. Next, the substrate was subjected to heat treatment in a $N_2$ atmosphere at 300° C. for 30 minutes, followed by etching back by CMP until thickness of the copper film reached 1400 nm, thereby preparing a sample 1.

Next, the surface of the sample 1 was contacted with (immersed in) a pre-treatment liquid containing 0.1 M of $H_2SO_4$ and 0.01 g/L of benzotriazole at 25° C. for one minute, followed by rinsing (cleaning) with pure water. The surface of the sample 1 was then contacted with (immersed in) a catalytic treatment liquid containing 0.1 M of $PdSO_4$, 0.1 M of $H_2SO_4$ and 0.01 g/L of benzotriazole at 25° C. for one minute, followed by rinsing (cleaning) with pure water. Next, the surface of the sample 1 was immersed in an electroless CoWP-plating solution having the following composition under the following conditions to carry out electroless plating of the surface of the sample 1.

Composition of Plating Solution
- $CoSO_4.7H_2O$: 14 g/L
- $Na_3C_6H_5O_7.2H_2O$: 80 g/L
- $(NH_4)_2SO_4$: 60 g/L
- $NaH_2PO_2$: 20 g/L
- $Na_2WO_4.2H_2O$: 40 g/L
- pH: 10 (adjusted with NaOH solution)

Plating Conditions
- Liquid temp.: 85° C.
- Plating time: 2 min

According to Example 1, a CoWP alloy film was formed uniformly over the surface of the copper film, and no void was observed in the copper film.

COMPARATIVE EXAMPLE 1

The same sample 1 as used in Example 1 was prepared, and the surface of the sample 1 was contacted with (immersed in) a 0.1 M aqueous solution of $H_2SO_4$ (pre-treatment liquid) at 25° C. for one minute, followed by rinsing (cleaning) with pure water. The surface of the sample 1 was then contacted with (immersed in) a catalytic treatment liquid containing 0.1 M of $PdSO_4$ and 0.1 M of $H_2SO_4$ at 25° C. for one minute, followed by rinsing (cleaning) with pure water. Next, the surface of the sample 1 was immersed in an electroless CoWP-plating solution having the same composition as described above under the same conditions as described above to carry out electroless plating of the surface of the sample 1.

Figure 29A:
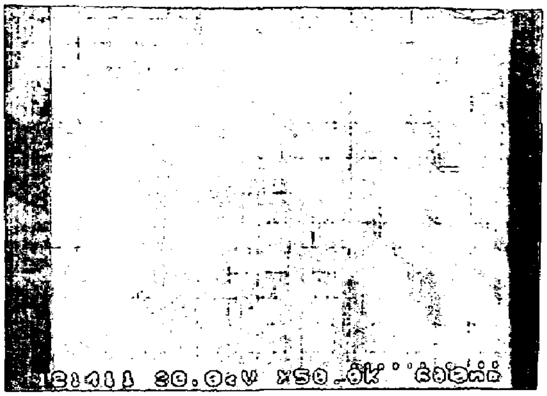
FIG. 29A is an SEM photograph of a surface of a substrate (copper film) before pretreatment in Comp. Example 1.
Figure 29B:
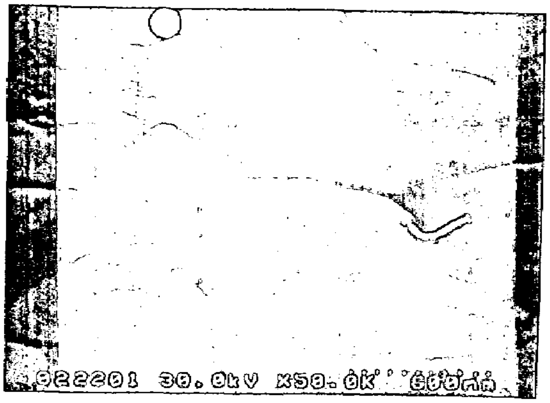
FIG. 29B is an SEM photograph of the substrate surface after pretreatment in Comp. Example 1.
Figure 29C:
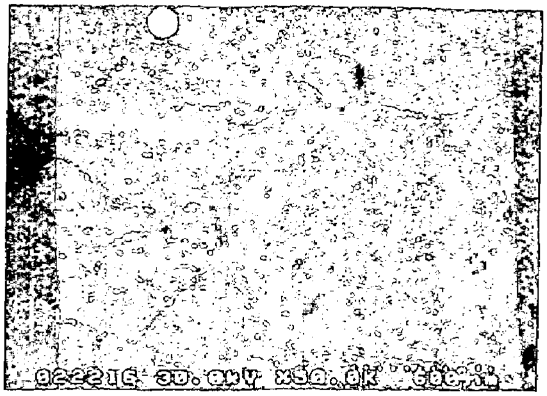
FIG. 29C is an SEM photograph of the substrate surface after catalytic treatment in Comp. Example 1.
Figure 29D:
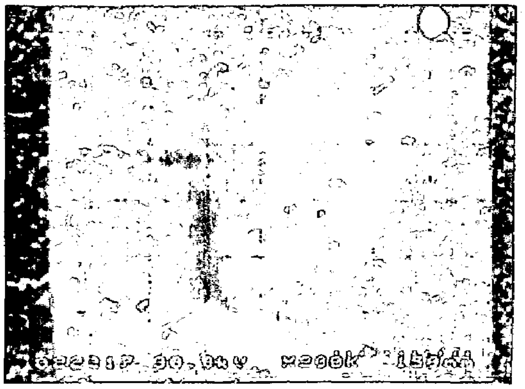
FIG. 29D is an enlarged photograph of FIG. 29C.

FIGS. 29A through 29D are SEM photographs of the same sample 1. In particular, FIG. 29A shows the surface of the copper film of the sample 1. The contrast in FIG. 2A indicates random orientations of copper crystals. FIG. 29B shows the surface of the copper film after the pretreatment. FIG. 29B demonstrates selective surface etching of copper crystal grain boundaries, resulting in the formation of recesses along the crystal grain boundaries in the surface of the copper film. FIG. 29C shows the surface of the copper film after the catalytic treatment, and FIG. 29D is an enlarged view of a portion of FIG. 29C. FIGS. 29C and 29D clearly demonstrate the formation of voids at copper crystal grain boundaries.

EXAMPLE 2

30 nm-thick TaN was deposited on a surface of a silicon substrate having a trench pattern of 0.5 μm width and 0.5 μm depth formed in an insulating film of $SiO_2$, and copper plating of the surface of the substrate was carried out to thereby embed copper in the trench pattern. Next, an extra copper film deposited on the surface of the substrate and TaN deposited on the surface of the substrate other than the trench pattern were polished away into a flat surface by CMP, thereby preparing a sample 2 having an interconnect of copper formed in the trench pattern.

Next, the surface of the sample 2 was contacted with (immersed in) a 0.1 M aqueous solution of $H_2SO_4$ (pre-treatment liquid) at 25° C. for one minute, followed by rinsing (cleaning) with pure water. The surface of sample 2 was then contacted with (immersed in) a catalytic treatment liquid containing 0.1 M of $PdSO_4$, 0.1 M of $H_2SO_4$ and 0.01 g/L of benzotriazole at 25° C. for one minute, followed by rinsing (cleaning) with pure water. Next, the surface of the sample 2 was immersed in an electroless CoWP-plating solution having the same composition as described above under the same conditions as described above to carry out electroless plating of the surface of the sample 2.

Figure 30A:
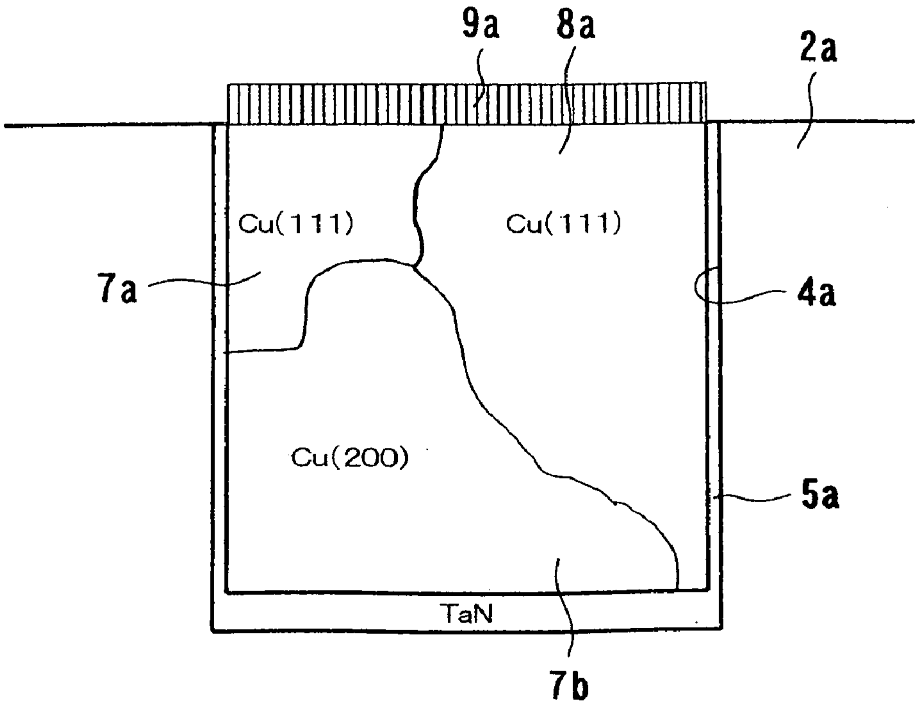
FIG. 30A is a diagram schematically showing a cross-section of the substrate obtained in Example 2.

FIG. 30A schematically shows the main portion of a cross-section of the substrate obtained in Example 2. As can be seen from FIG. 30A, an interconnect 8*a*, for example, comprising copper crystals 7*a* having a (111) plane orientation and copper crystals 7*b* having a (200) plane orientation, is formed in a trench 4*a*, having a barrier layer 5*a* of TaN formed in the surface, formed in an insulating film 2*a* of $SiO_2$, and a protective film 9*a* is formed selectively on the surface of the interconnect 8*a* without the formation of voids in the interconnect 8*a*, for example at the crystal grain boundaries of the copper crystals 7*a*, 7*b* or at the interfaces between the copper crystals and the barrier layer 5*a*.

COMPARATIVE EXAMPLE 2

The same sample 2 as used in Example 2 was prepared, and the surface of the sample 2 was contacted with (immersed in) a 0.1 M aqueous solution of $H_2SO_4$ (pre-treatment liquid) at 25° C. for one minute, followed by rinsing (cleaning) with pure water. The surface of the sample 2 was then contacted with (immersed in) a catalytic treatment liquid containing 0.1 M of $PdSO_4$ and 0.1 M of $H_2SO_4$ at 25° C. for one minute, followed by rinsing (cleaning) with pure water. Next, the surface of the sample 2 was immersed in an electroless CoWP-plating solution having the same composition as described above under the same conditions as described above to carry out electroless plating of the surface of the sample 2.

Figure 30B:
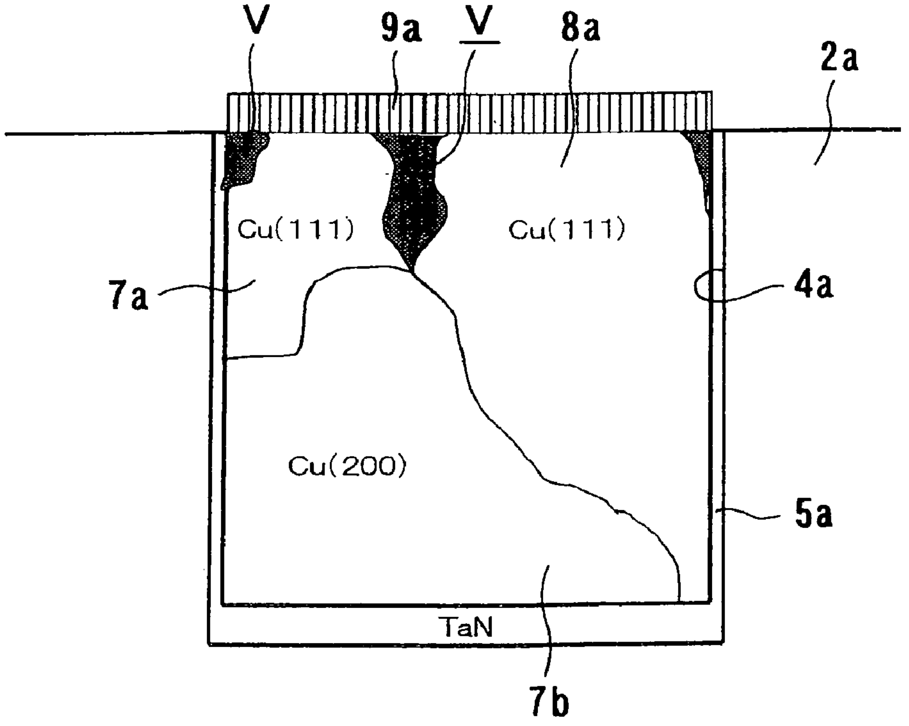
FIG. 30B is a diagram schematically showing a cross-section of the substrate obtained in Comp. Example 2.
Figure 31A:
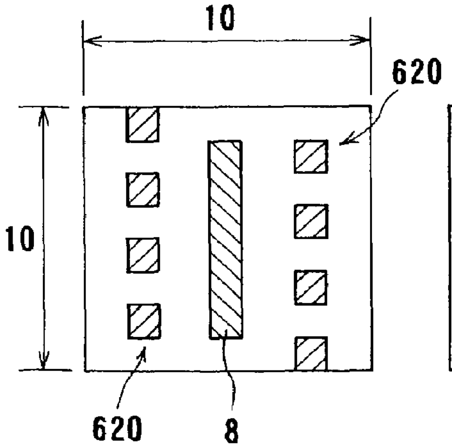
FIGS. 31A through 31C are plan views illustrating a substrate having a variety of interconnect patterns, with dummy patterns provided by an interconnects-forming method according to an embodiment of the present invention.
Figure 31B:
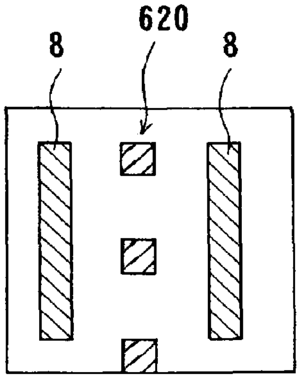
Figure 31C:
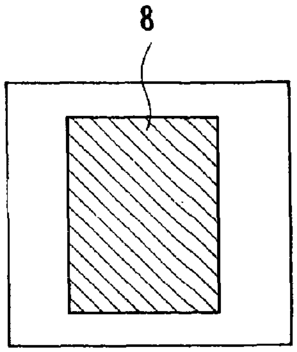

FIG. 30B schematically shows the main portion of a cross-section of the substrate obtained in Comp. Example 2. As can be seen from FIG. 30B, an interconnect 8*a*, for example, comprising copper crystals 7*a* having a (111) plane orientation and copper crystals 7*b* having a (200) plane orientation, is formed in a trench 4*a*, having a barrier layer 5*a* of TaN formed in the surface, formed in an insulating film 2*a* of $SiO_2$, and a protective film 9*a* is formed selectively on the surface of the interconnect 8*a*, while voids V are formed in the interconnect 8*a* along a crystal grain boundary of the copper crystals 7*a* having a (111) plane orientation and along the interfaces between the copper crystals 7*a* having a (111) plane orientation and the barrier layer 5*a*.

As described hereinabove, according to the present invention, a metal film (protective film) can be securely formed by electroless plating on the exposed surfaces of a base metal, such as interconnects, without the formation of voids in the base metal. The present invention thus makes it possible to selectively cover and protect surfaces of interconnects of a semiconductor device having an embedded interconnect structure without entailing a lowering of the reliability of the interconnects or an increase in the resistance of the interconnects.

The interconnects-forming method of the present invention will now be described.

Figures 6A, 6B, 6C:
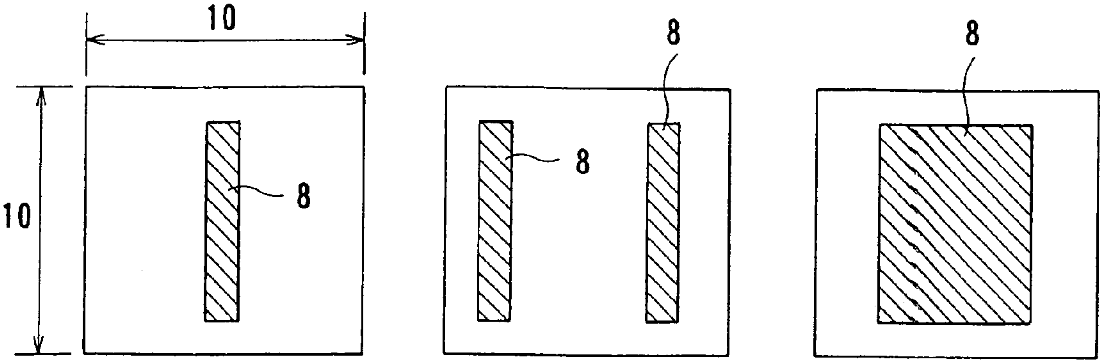
FIG. 6A through 6C are plan views schematically showing a conventional substrate having a variety of interconnect patterns.
Figure 7:
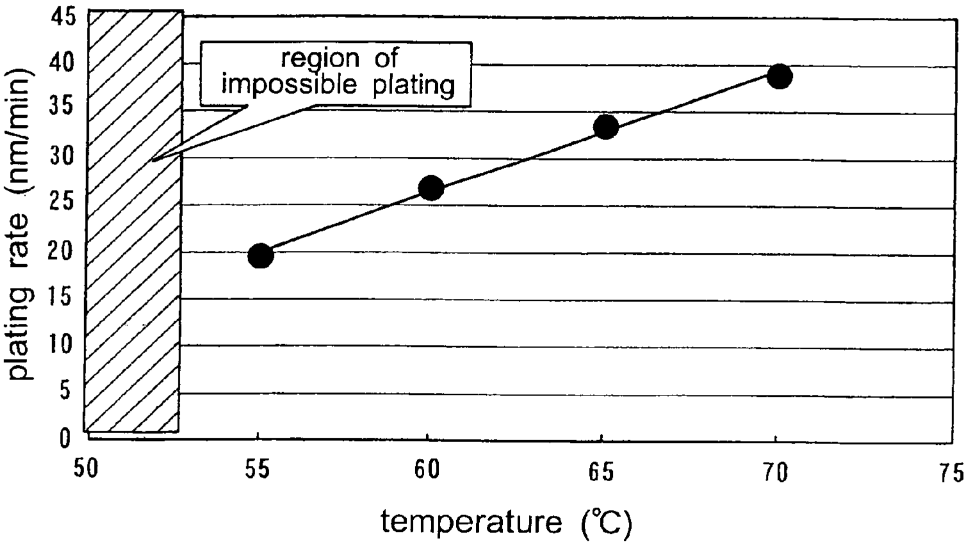
FIG. 7 is a graph showing the relationship between the plating rate and the temperature of plating solution in electroless CoWB plating.
Figures 8A, 8B, 8C:
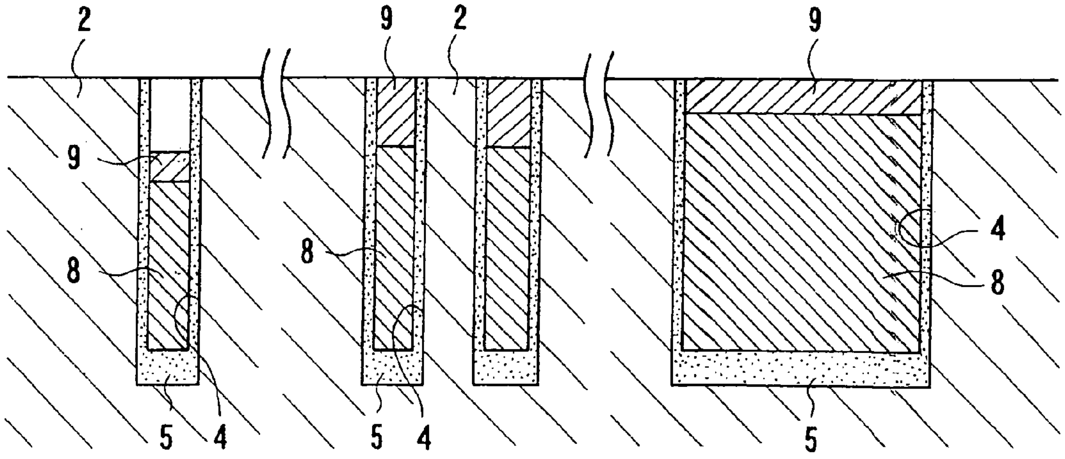
FIGS. 8A through 8C are cross-sectional diagrams showing the state of another conventional substrate having a variety of interconnect patterns after selectively forming a protective film on the substrate.

FIGS. 31A through 34C illustrate the formation of interconnects by an interconnects-forming method according to an embodiment of the present invention in a case where, as with the above-described case shown in FIGS. 6A through 6C, a first interconnect pattern (FIG. 31A) comprising a single interconnect (reaction region) 8 having a surface area of 2×10 in a region (area) of 10×10, a second interconnect pattern (FIG. 31B) comprising two interconnects (reaction regions) each having a surface area of 2×10 in a region of 10×10, and a third interconnect pattern (FIG. 31C) comprising a single interconnect (reaction region) 8 having a surface area of 5.2×10 in a region of 10×10, are co-present in the surface of a substrate.

In forming interconnects on a substrate having such a variety of interconnect patterns, a dummy pattern 620 is first provided in such a manner that the surface area per unit area of the sum of the dummy pattern and an interconnect pattern becomes uniform over the entire surface of the substrate. In the above case, the ratio of the reaction region to the whole region in the third interconnect pattern shown in FIG. 31C, i.e. 0.52 (52/100), is largest. Accordingly, a dummy pattern is provided in each other interconnect pattern so that the ratio becomes equal to the largest ratio in the third pattern. In particular, for the first pattern shown in FIG. 31A, a total of 8 dummy patterns 620 each having a surface area of 2×2, for example, are provided along the interconnect 8 on both sides thereof, so that the ratio of the area of the sum of the interconnect 8 and the dummy patterns 620, together constituting the reaction region, to the whole region becomes 0.52 ((20+2×2×8)/100) which is equal to the ratio in the third interconnect pattern shown in FIG. 31C. For the second interconnect pattern shown in FIG. 31B, a total of 3 dummy patterns 620 each having a surface area of 2×2, for example, are provided between the two interconnects 8, so that the ratio of the area of the sum of the interconnects 8 and the dummy patterns 620, together constituting the reaction region, to the whole region becomes 0.52 ((2×20+2×2×3)/100) which is equal to the ratio in the third interconnect pattern shown in FIG. 31C.

Thus, besides trenches 4 as interconnect recesses, dummy interconnect recesses 622 are formed in conformity with the configuration of dummy patterns 620, for example, by the lithography/etching technique in an insulating film (interlevel dielectric layer) 2 composed of, for example, $SiO_2$ or a low-k material, deposited on a substrate W. Thereafter, a barrier layer 5 of TaN or the like and a seed layer (not shown), serving as an electric feeding layer in electroplating, are formed in this order by sputtering or the like.

Copper plating of the surface of the substrate W is carried out to fill the trenches 4 and the dummy interconnect recesses 622 with copper and deposit a copper film on the insulating film 2. Thereafter, the barrier layer 5, the seed layer and the copper film on the insulating film 2 are removed by chemical-mechanical polishing (CMP) or the like, thereby making the surface of the copper film filling the trenches 4 and the dummy interconnect recesses 622 substantially flush with the surface of the insulating film 2. Interconnects 8 conforming to the interconnect patterns and dummy interconnects 624 conforming to the dummy patterns 620 are thus formed in the insulating film 2.

Figure 32A:
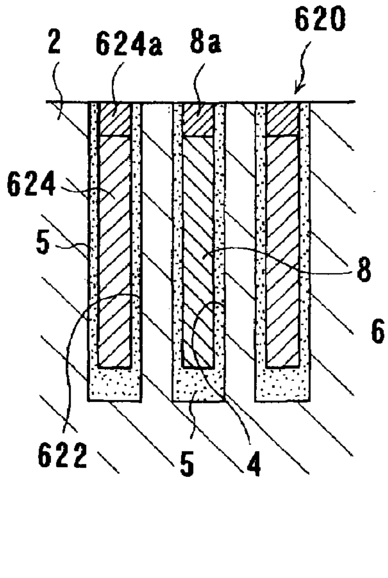
FIGS. 32A through 32C are cross-sectional diagrams showing the state of the same substrate shown in FIGS. 31A through 31C but after carrying out CMP of the substrate surface.
Figure 32B:
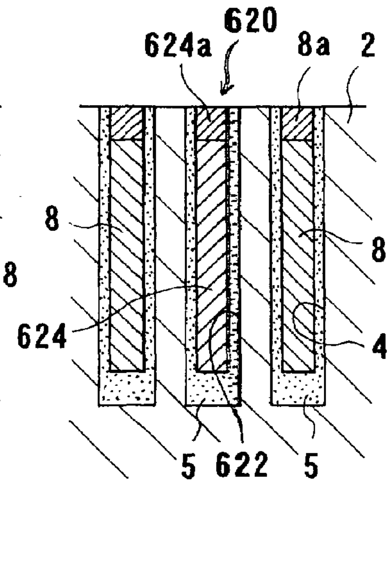
Figure 32C:
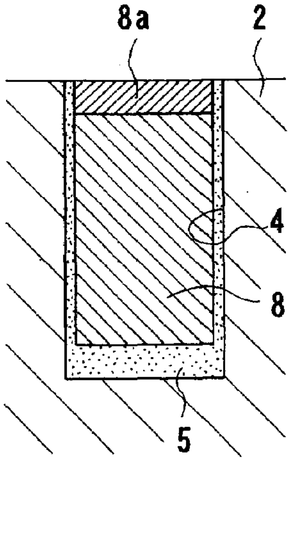

Polishing and removal of copper by CMP is generally carried out by oxidizing the copper and polishing away the copper oxide. Accordingly, as shown in FIGS. 32A through 32C, oxide films **8*a* are formed in the upper portions of the interconnects 8 and oxide films 624*a* are formed also in the upper portions of the dummy interconnects 624. The oxide films 8*a* are formed with a uniform thickness, without depending on the interconnect pattern configuration and without entailing a difference in reaction produced by the rate limitation of the supply of reaction species. In particular, in the first and second interconnect patterns, oxide films 8*a* are formed in the upper portions of the interconnects 8, and oxide films 624*a* are also formed in the upper portions of the dummy interconnects 624, as shown in FIGS. 32A and 32B. In the third interconnect pattern, an oxide film 8*a* is formed only in the upper portion of the interconnect 8, as shown in FIG. 32C. The oxide film-forming region, which is the sum of interconnect pattern and dummy pattern, is substantially equal for all the interconnect patterns. Accordingly, the thicknesses of the oxide films 8*a*, 624*a*** are substantial equal for all the interconnect patterns.

Figure 33A:
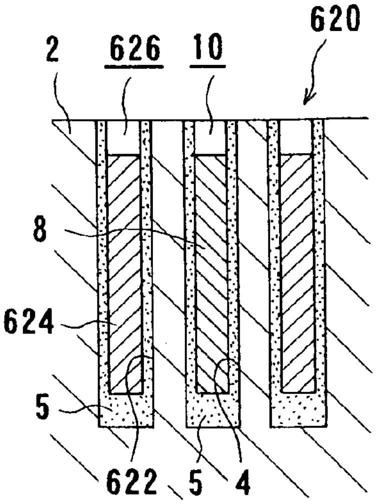
FIGS. 33A through 33C are cross-sectional diagrams showing the state of the same substrate shown in FIGS. 32A through 32C but after carrying out pre-plating treatment of the substrate surface to remove an oxide film.
Figure 33B:
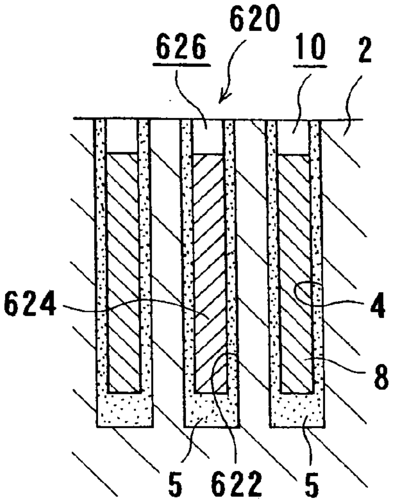
Figure 33C:
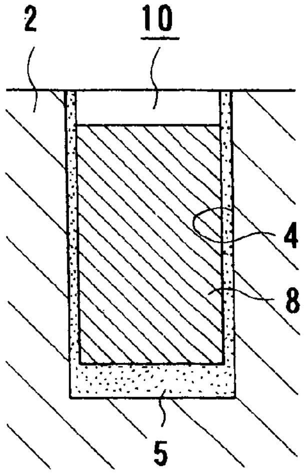

Next, pre-electroless plating treatment of the substrate W is carried out by, for example, immersing the substrate in a 0.5 ml/L $H_2SO_4$ solution for one minute, thereby removing the oxide films **8*a* formed in the upper portions of the interconnects 8 and the oxide films 624*a* formed in the upper portions of the dummy interconnects 624. Upon this treatment, as shown in FIGS. 33A through 33C, spaces 10 having heights equal to the thicknesses of the corresponding oxide films 8*a* removed are formed in the upper portions of the trenches 4, and spaces 626 having heights equal to the thicknesses of the corresponding oxide films 624*a* removed are formed in the upper portions of the dummy interconnect recesses 622. Thus, in the first and second interconnect patterns, spaces 10 are formed in the upper portions of the interconnects 8, and spaces 626 are formed in the upper portions of the dummy interconnects 624, as shown in FIGS. 33A and 33B. In the third interconnect pattern, a space 10 is formed in the upper portion of the interconnect 8, as shown in FIG. 33C. The heights of the spaces 10, 626** are substantial equal for all the interconnect patterns.

Thereafter, electroless plating of the substrate is carried out, for example, for one minute using, for example, an electroless NiB-plating solution having the following composition, thereby forming a protective film 9 of a NiB alloy having a thickness of about 40 nm selectively on the surfaces of the interconnects 8. By the electroless plating, a dummy protective film 628 is also formed on the dummy interconnects 624.

Composition of Plating Solution

- $NiSO_4.6H_2O$: 0.02 mol/L
- Malic acid: 0.02 mol/L
- Glycine: 0.03 mol/L
- pH=10
- Temp. 60° C.

Protective films 9 are formed with a uniform thickness, without depending on the interconnect pattern configuration and without entailing a difference in reaction produced by the rate limitation of the supply of reaction species. In particular, in the first and second interconnect patterns, protective films 9 are formed in the upper portions of the interconnects 8, and dummy protective films 628 are also formed in the upper portions of the dummy interconnects 624, as shown in FIGS.

Figure 34A:
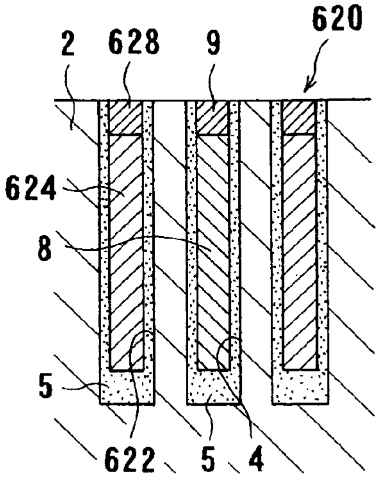
FIGS. 34A through 34C are cross-sectional diagrams showing the state of the same substrate shown in FIGS. 33A through 33C but after selectively forming a protective film on the pre-treated substrate.
Figure 34B:
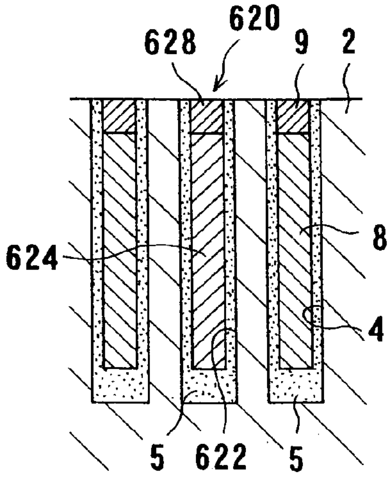
Figure 34C:
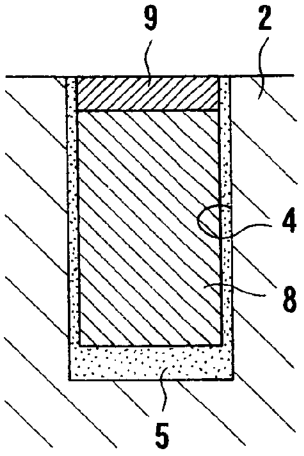

34A and 34B. In the third interconnect pattern, a protective film 9 is formed only in the upper portion of the interconnect 8, as shown in FIG. 34C. The protective film-forming region, which is the sum of interconnect pattern and dummy pattern, is substantially equal for all the interconnect patterns. Accordingly, the thicknesses of the protective films 9, 628 are substantial equal for all the interconnect patterns.

According to this embodiment, a dummy pattern, constituting a reaction region, may be provided at a desired location, for example, in the vicinity of an isolated narrow interconnect, to increase the local reaction region so that the surface area per unit area of the sum of dummy pattern and interconnect pattern can be made uniform over the entire surface of the substrate. Accordingly, the thickness of an oxide film formed in the upper portion of interconnects upon removal of an extra metal on the substrate and flattening of the substrate surface by CMP, and the thickness of a protective film formed by electroless plating, for example, can be made uniform, without depending on the interconnect pattern configuration, over the entire surface of the substrate.

FIGS. 35A through 37C illustrate the formation of interconnects by an interconnects-forming method according to another embodiment of the present invention in a case where, as with the above-described case shown in FIGS. 6A through 6C, a first interconnect pattern (FIG. 35A) comprising a single interconnect (reaction region) 8 having a surface area of 2×10 in a region (area) of 10×10, a second interconnect pattern (FIG. 35B) comprising two interconnects (reaction regions) each having a surface area of 2×10 in a region of 10×10, and a third interconnect pattern (FIG. 35C) comprising a single interconnect (reaction region) 8 having a surface area of 5.2×10 in a region of 10×10, are co-present in the surface of a substrate.

In forming interconnects on a substrate having such a variety of interconnect patterns, a dummy pattern 630 is first provided in such a manner that the volume per unit area of the sum of the interconnect material embedded in an interconnect pattern and the interconnect material embedded in the dummy pattern 630 becomes uniform over the entire surface of the substrate. In the above case, the volume of copper as an interconnect material embedded in the third interconnect pattern, constituting the interconnect 8 shown in FIG. 35C, is largest. Accordingly, a dummy pattern is provided in each other interconnect pattern so that the volume of embedded copper becomes equal to the largest volume in the third pattern.

Figure 35A:
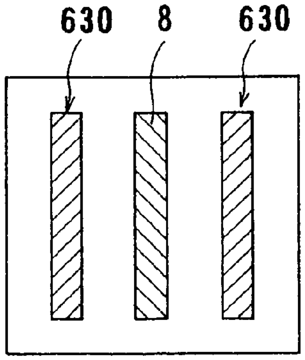
FIGS. 35A through 35C are plan views illustrating a substrate having a variety of interconnect patterns, with dummy patterns provided by an interconnects-forming method according to another embodiment of the present invention.
Figure 35B:
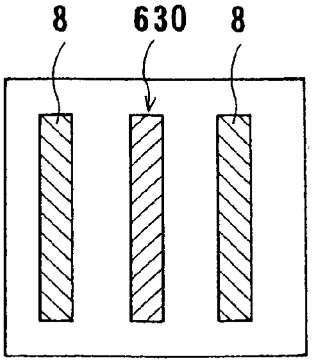
Figure 35C:
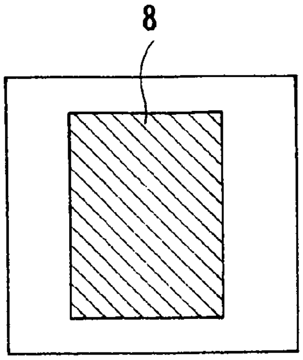

In particular, for the first interconnect pattern shown in FIG. 35A, two dummy patterns, each extending parallel to the interconnect 8, are provided along the interconnect 8 on both sides thereof. For the second interconnect pattern shown in FIG. 35B, a single dummy pattern 630, extending parallel to the interconnects 8, is provided between the interconnects 8. By the provision of these dummy patterns, as described bellow, the total volume ($V_1+2V_2$) of the volume $V_1$ of copper as an interconnect material, constituting the single interconnect 8, and the volume $2V_2$ of copper embedded in the two dummy patterns 630 in the first interconnect pattern, shown in FIG. 36A; the total volume ($2V_1+V_2$) of the volume $2V_1$ of copper as an interconnect material, constituting the two interconnects 8, and the volume $V_2$ of copper embedded in the single dummy pattern 630 in the second interconnect pattern, shown in FIG. 36B; and the volume $V_0$ of copper as an interconnect material, constituting the interconnect 8, in the third pattern, shown in FIG. 36C, become equal ($V_1+2V_2=2V_1+V_2=V_0$).

Thus, besides trenches 4 as interconnect recesses, dummy interconnect recesses 632 are formed in conformity with the configuration of dummy patterns 630, for example, by the lithography/etching technique in an insulating film (interlevel dielectric layer) 2 composed of, for example, $SiO_2$ or a low-k material, deposited on a substrate W. Thereafter, a barrier layer 5 of TaN or the like and a seed layer (not shown), serving as an electric feeding layer in electroplating, are formed in this order by sputtering or the like.

Copper plating of the surface of the substrate W is carried out to fill the trenches 4 and the dummy interconnect recesses 632 with copper and deposit a copper film on the insulating film 2. Thereafter, the barrier layer 5, the seed layer and the copper film on the insulating film 2 are removed by chemical-mechanical polishing (CMP) or the like, thereby making the surface of the copper film filling the trenches 4 and the dummy interconnect recesses 632 substantially flush with the surface of the insulating film 2. Interconnects 8 conforming to the interconnect patterns and dummy interconnects 634 conforming to the dummy patterns 630 are thus formed in the insulating film 2.

Polishing and removal of copper by CMP is generally carried out by oxidizing the copper and polishing away the copper oxide, as described above. Accordingly, oxide films are formed in the upper portions of the interconnects 8 and in the upper portions of the dummy interconnects 634. Next, pre-electroless plating treatment of the substrate is carried out by, for example, immersing the substrate in a 0.5 ml/L $H_2SO_4$ solution for one minute, thereby removing the oxide films formed in the upper portions of the interconnects 8 and the oxide films formed in the upper portions of the dummy interconnects 634, as shown in FIGS. 36A through 36C.

Figure 36A:
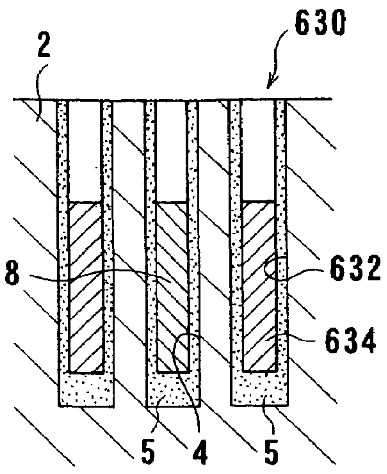
FIGS. 36A through 36C are cross-sectional diagrams showing the state of the same substrate shown in FIGS. 35A through 35C but after selectively forming a protective film on the pre-treated substrate.
Figure 36B:
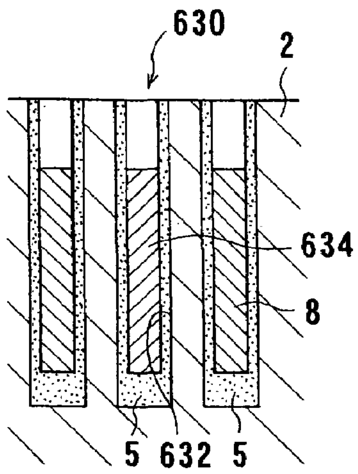
Figure 36C:
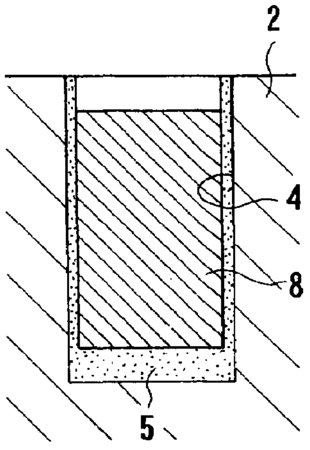

In the first interconnect pattern, besides an interconnect 8, dummy interconnects 634, extending parallel to the interconnect 8, are formed along the interconnect 8 on both sides thereof, as shown in FIG. 36A. In the second interconnect pattern, besides interconnects 8, a dummy interconnect 634, extending parallel to the interconnects 8, is formed between the interconnects 8, as shown in FIG. 36B. In the third interconnect pattern, only the interconnect 8 is formed, as shown in FIG. 36C. The total volume of the volume $V_1$ of copper (interconnect material), constituting the interconnect 8, and the volume $2V_2$ of copper, constituting the dummy interconnects 634, in the first interconnect pattern; the total volume of the volume $2V_1$ of copper (interconnect material), constituting the interconnects 8, and the volume $V_2$ of copper, constituting the dummy interconnect 634, in the second interconnect pattern; and the volume $V_0$ of copper (interconnect material), constituting the interconnect 8, in the third pattern, are equal.

Thereafter, electroless plating of the substrate is carried out, for example, for one minute using, for example, an electroless CoWB-plating solution having the following composition, thereby forming a protective film 9 of a CoWB alloy selectively on the surfaces of the interconnects 8. By the electroless plating, a dummy protective film 638 is also formed on the dummy interconnects 634.

Composition of Plating Solution $CoSO_4.7H_2O$: 0.10 mol/L
L-tartaric acid: 0.50 mol/L
$(NH_4)_2SO_4$: 0.20 mol/L
$H_2WO_4$: 0.10 mol/L
DMAB: 0.02 mol/L
TMAH (27%): 0.80 mol/L
pH=9
Temp. 70° C.

Figure 37A:
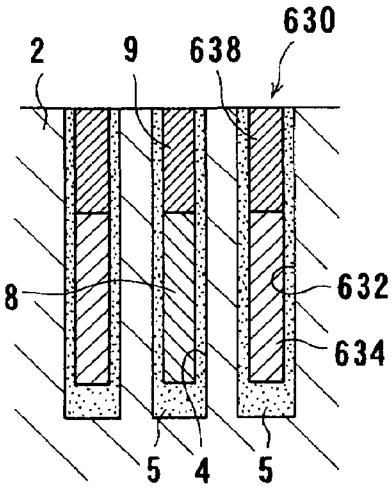
FIGS. 37A through 37C are cross-sectional diagrams showing the state of the same substrate shown in FIGS. 36A through 36C but after carrying out copper plating of the substrate surface for embedding of copper.
Figure 37B:
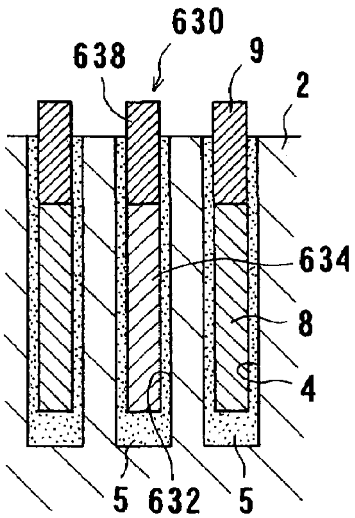
Figure 37C:
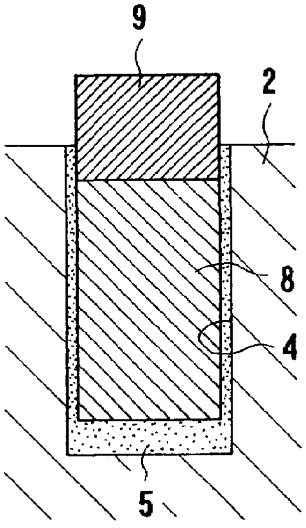

Protective films 9, having a uniform thickness over the entire surface of the substrate, can be formed stably on the surfaces of interconnects 8 without being influenced by local differences in heat capacity in the substrate. In particular, in the first and second interconnect patterns, protective films 9 are formed in the upper portions of the interconnects 8, and dummy protective films 638 are also formed in the upper portions of the dummy interconnects 634, as shown in FIGS. 37A and 37B. In the third interconnect pattern, a protective film 9 is formed only in the upper portion of the interconnect 8, as shown in FIG. 37C. In the respective interconnects-forming regions, the interconnect material (copper) embedded in the interconnect pattern and the dummy pattern serves as a heat capacity source, and the volume of the heat capacity source is substantially equal for all the interconnect patterns. Accordingly, the thicknesses of the protective films 9, 638 are substantially equal for all the interconnect patterns.

According to this embodiment, a dummy pattern, serving as a heat capacity source, can be provided at a desired location, for example, in the vicinity of an isolated narrow interconnect, thereby increasing the local heat capacity so that the heat capacity upon electroless plating can be equalize over the entire surface of the substrate. This can equalize the thickness of a protective film, which is formed by electroless plating on the surfaces of interconnects, over the entire surface of the substrate.

The present invention makes it possible to form a protective film, which selectively covers the surfaces of embedded interconnects and protects the interconnects, stably and securely by e.g. electroless plating, thus enhancing the reliability of the interconnects and increasing the throughput.

What is claimed is:

1. A plating method comprising:

carrying out pretreatment of a surface of a base metal of a substrate using a pre-treatment liquid containing a surface activating agent for activating the surface of the base metal and an excessive etching inhibitor for inhibiting excessive etching of the base metal;

after said carrying out pretreatment of the surface of the base metal of the substrate, contacting the substrate with a catalytic treatment liquid so as to apply a catalyst to the surface of the base metal of the substrate;

after said contacting the substrate with the catalytic treatment liquid, forming a metal film by electroless plating on the surface of the base metal of the substrate; and after said contacting the substrate with the catalytic treatment liquid, carrying out a post-catalyzation treatment of the surface of the base metal by jetting a post-treatment liquid toward the surface of the base metal of the substrate so as remove any excess of the excessive etching inhibitor.

2. The plating method according to claim 1, wherein the surface activating agent for activating the surface of the base metal is an inorganic acid, an organic acid, an inorganic alkali or an organic alkali.

3. The plating method according to claim 1, wherein the excessive etching inhibitor for inhibiting excessive etching of the base metal is a compound having an atom chemically adsorbed to the base metal.

4. The plating method according to claim 3, wherein the atom chemically adsorbed to the base metal is an N atom.

5. The plating method according to claim 4, wherein the excessive etching inhibitor for inhibiting excessive etching of the base metal is a compound having an amine structure.

6. The plating method according to claim 1, wherein the substrate is a semiconductor device having an embedded interconnect structure, wherein the base metal comprises exposed interconnects of the embedded interconnect structure, and the metal film comprises a protective film selectively formed on the surface of the base metal.

7. The plating method according to claim 6, wherein the interconnects of the semiconductor device are composed of Cu, a Cu alloy, Ag or an Ag alloy.

8. The plating method according to claim 6, wherein the protective film is composed of CoWP, CoWB, CoP, CoB, a Co alloy, NiWP, NiWB, NiP, NiB or a Ni alloy.

9. The plating method according to claim 1, wherein the base metal is copper.

10. The plating method according to claim 1, wherein the post-treatment liquid is an alkali solution.

11. The plating method according to claim 1, further comprising, after said carrying out of the post catalyzation treatment of the surface of the base metal, rinsing the surface of the base metal with pure water.

12. The plating method according to claim 1, further comprising, after said forming the metal film by electroless plating, carrying out a post-plating treatment on a surface of the metal film to remove plating residue.

13. The plating method according to claim 12, wherein the post-plating treatment comprises applying a physical force to the surface of the metal film while applying a treatment liquid to the surface of the metal film.

14. The plating method according to claim 1, wherein the catalyst is Pd, Sn, Ag, Pt, Au, Cu, Co, or Ni.

15. A plating method comprising:

carrying out pretreatment of a copper surface of a substrate using a pre-treatment liquid containing a surface activating agent for activating the copper surface and an excessive etching inhibitor for inhibiting excessive etching of the substrate;

after said carrying out pretreatment of the copper surface of the substrate, contacting the substrate with a catalytic treatment liquid so as to apply a catalyst to the copper surface of the substrate;

after said contacting the substrate with the catalytic treatment liquid, forming a metal film by electroless plating on the copper surface of the substrate; and after said contacting the substrate with the catalytic treatment liquid, carrying out a post-catalyzation treatment of the copper surface by jetting a post-treatment liquid toward the copper surface of the substrate so as remove any excess of the excessive etching inhibitor.

16. The plating method according to claim 15, wherein the post-treatment liquid is an alkali solution.

17. The plating method according to claim 15, further comprising, after said carrying out of the post catalyzation treatment of the copper surface, rinsing the copper surface with pure water.

18. The plating method according to claim 15, further comprising, after said forming the metal film by electroless plating, carrying out a post-plating treatment on a surface of the metal film to remove plating residue.

19. The plating method according to claim 18, wherein the post-plating treatment comprises applying a physical force to the surface of the metal film while applying a treatment liquid to the surface of the metal film.

20. The plating method according to claim 15, wherein the catalyst is Pd, Sn, Ag, Pt, Au, Cu, Co, or Ni.

* * * * *